(12) United States Patent
Okada

(10) Patent No.: US 10,163,953 B2
(45) Date of Patent: Dec. 25, 2018

(54) IMAGE PICKUP DEVICE AND METHOD OF MANUFACTURING THE SAME

(71) Applicant: Renesas Electronics Corporation, Koutou-ku, Tokyo (JP)

(72) Inventor: Yasutaka Okada, Hitachinaka (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/494,473

(22) Filed: Apr. 22, 2017

(65) Prior Publication Data

US 2017/0229495 A1    Aug. 10, 2017

Related U.S. Application Data

(62) Division of application No. 15/019,089, filed on Feb. 9, 2016, now Pat. No. 9,647,023.

(30) Foreign Application Priority Data

Feb. 10, 2015 (JP) .................................. 2015-024059

(51) Int. Cl.
*H01L 27/148* (2006.01)
*H01L 27/146* (2006.01)

(52) U.S. Cl.
CPC ...... *H01L 27/1463* (2013.01); *H01L 27/1462* (2013.01); *H01L 27/14612* (2013.01); *H01L 27/14621* (2013.01); *H01L 27/14627* (2013.01); *H01L 27/14636* (2013.01); *H01L 27/14643* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 4,488,165 A | * | 12/1984 | Levine | H01L 27/14649 257/227 |
| 5,767,538 A | * | 6/1998 | Mullins | H03F 1/08 257/115 |
| 6,351,002 B1 | * | 2/2002 | Pan | H01L 27/14609 257/233 |

(Continued)

FOREIGN PATENT DOCUMENTS

| JP | 2001-332714 A | 11/2001 |
| JP | 2006-269546 A | 10/2006 |

(Continued)

OTHER PUBLICATIONS

Office Action dated Oct. 2, 2018, in Japanese Patent Application No. 2015-024059.

*Primary Examiner* — Ali Naraghi
(74) *Attorney, Agent, or Firm* — Shapiro, Gabor and Rosenberger, PLLC

(57) ABSTRACT

A P-type well is defined by an isolation region formed in a semiconductor substrate. A pixel region and a ground region are defined in the P-type well. In the pixel region, a pixel transistor region and a photodiode region having a photodiode formed therein are defined. An antireflection film is formed so as to cover at least the photodiode region and the ground region. A plug connected to the ground region is formed so as to extend through the antireflection film and the like.

7 Claims, 45 Drawing Sheets

(56) References Cited

U.S. PATENT DOCUMENTS

| | | | |
|---|---|---|---|
| 8,664,734 B2* | 3/2014 | Wu | H01L 31/103 |
| | | | 257/431 |
| 8,759,933 B2* | 6/2014 | Toumiya | H01L 27/14625 |
| | | | 257/437 |
| 9,224,780 B2 | 12/2015 | Goto | |
| 2007/0108546 A1 | 5/2007 | Furuichi | |
| 2007/0120131 A1 | 5/2007 | Hasegawa et al. | |
| 2008/0217659 A1* | 9/2008 | Hung | H01L 27/14654 |
| | | | 257/223 |
| 2010/0116971 A1 | 5/2010 | McCarten et al. | |
| 2010/0188545 A1 | 7/2010 | Stevens et al. | |
| 2015/0060951 A1* | 3/2015 | Hynecek | H01L 27/14612 |
| | | | 257/228 |

FOREIGN PATENT DOCUMENTS

| | | |
|---|---|---|
| JP | 2007-149842 A | 6/2007 |
| JP | 2007-165864 A | 6/2007 |
| JP | 2010-219233 A | 9/2010 |
| JP | 2012-015160 A | 1/2012 |
| JP | 2012-146989 A | 8/2012 |
| JP | 2014-007316 A | 1/2014 |

* cited by examiner

IMAGE PICKUP DEVICE AND METHOD OF MANUFACTURING THE SAME

This nonprovisional application is based on Japanese Patent Application No. 2015-024059 filed on Feb. 10, 2015, with the Japan Patent Office, the entire contents of which are hereby incorporated by reference.

BACKGROUND OF THE INVENTION

Field of the Invention

The present invention relates to an image pickup device and a method of manufacturing the same, and can be suitably applied to an image pickup device including a photodiode region and a ground region.

Description of the Background Art

An image pickup device including, for example, a CMOS (Complementary Metal Oxide Semiconductor) image sensor is applied to a digital camera and the like. In the image pickup device, a photodiode is formed for converting the entering light into an electric charge. The electric charge generated in the photodiode is transferred to a floating diffusion region by a transfer transistor. The transferred electric charge is converted into an electrical signal by an amplification transistor, and then output as an image signal.

In the image pickup device, an antireflection film is formed so as to cause light to efficiently enter the photodiode while suppressing reflection of light. The antireflection film is formed by forming a silicon nitride film so as to cover a semiconductor substrate and subjecting this silicon nitride film to an etching process. For example, Japanese Patent Laying-Open No. 2012-146989 and Japanese Patent Laying-Open No. 2007-165864 each disclose an image pickup device including an antireflection film as described above.

SUMMARY OF THE INVENTION

In an image pickup device, a ground region electrically connecting an anode of a photodiode to a ground potential is arranged in the vicinity of a photodiode. This ground region is electrically connected to a ground potential through a plug formed inside a contact hole. In the ground region, when a silicon nitride film serving as an antireflection film is subjected to an etching process, a portion of the silicon nitride film that is located in the ground region is also to be removed such that a contact hole is excellently formed. At this time, etching damage may occur in a region where a photodiode is formed.

It was confirmed by the present inventor that a dark current is generated in the photodiode when etching damage occurs in the region where this photodiode is formed. The dark current is a current that flows through a photodiode despite that light does not enter the photodiode, and means a minute leakage current.

Other tasks and novel characteristics will become apparent from the description in the present specification and the accompanying drawings.

An image pickup device according to one embodiment includes: a semiconductor substrate; an element formation region; a pixel region; a photoelectric conversion portion; a ground region; an antireflection film; an interlayer insulating film; and a plug. The element formation region is defined in the semiconductor substrate and formed of a first impurity region having a first conductivity type. The pixel region is defined in the element formation region. The photoelectric conversion portion is formed in the pixel region. The ground region is defined in the element formation region adjacent to the photoelectric conversion portion with an isolation portion interposed therebetween. The ground region is electrically connected to the photoelectric conversion portion and electrically connected to a ground potential. The antireflection film is formed so as to cover at least the photoelectric conversion portion and the ground region. The plug is formed so as to extend through the interlayer insulating film and the antireflection film and electrically connected to the ground region.

A method of manufacturing an image pickup device according to another embodiment includes the following steps. An element formation region having a first conductivity type and including a pixel region and a ground region is defined in a semiconductor substrate. A photoelectric conversion portion is formed in the pixel region. An antireflection film suppressing reflection of light is formed so as to cover at least the photoelectric conversion portion and the ground region. An interlayer insulating film is formed so as to cover the antireflection film.

A plug is formed that extends through the interlayer insulating film and the antireflection film, comes into contact with the ground region, and electrically connects the ground region to a ground potential.

According to the image pickup device of one embodiment, generation of a dark current in a photoelectric conversion portion can be suppressed. According to the method of manufacturing an image pickup device of another embodiment, an image pickup device capable of suppressing generation of a dark current in a photoelectric conversion portion can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First, the entire configuration (circuit) of an image pickup device will be hereinafter briefly described. The image pickup device is formed of a plurality of pixels arranged in matrix form. In each of the pixels, a photodiode PD, a transfer transistor TT, an amplification transistor AMI, a selection transistor SEL, and a reset transistor RST are provided, as shown in FIG. 1.

In photodiode PD, light from a photographic subject is accumulated as electric charge. Transfer transistor TT transfers the electric charge to a floating diffusion region (not shown). Reset transistor RST resets the electric charge in the floating diffusion region before the electric charge is transferred to the floating diffusion region. The electric charge transferred to the floating diffusion region is input into a gate electrode of amplification transistor AMI, and converted into a voltage (Vdd), which is then amplified. When the signal for selecting a specific row of pixels is input into the gate electrode of selection transistor SEL, the signal converted into a voltage is read as an image signal.

Figure 1:
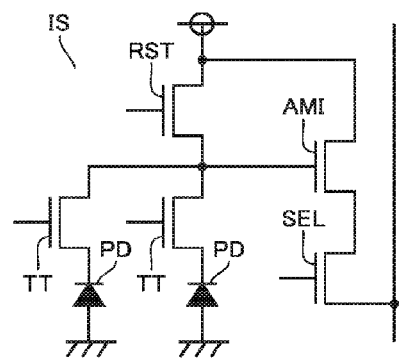
FIG. 1 is a diagram showing an example of a circuit of a pixel in an image pickup device according to each embodiment.

Thus, in the circuit shown in FIG. 1, the electric charges generated in two photodiodes PD are controlled by five transistors including two transfer transistors TT, one amplification transistor AMI, one selection transistor SEL, and one reset transistor RST. In other words, the electric charges are to be controlled by 2.5 transistors for one photodiode PD (2.5-transistor pixel).

It is to be noted that the circuit of a pixel is not limited to the above, but for example may be a circuit where electric charge generated in one photodiode is controlled by four transistors including one transfer transistor, one amplification transistor, one selection transistor, and one reset transistor (4-transistor pixel). Also, the circuit of a pixel may be a circuit where electric charges generated in four photodiodes are controlled by seven transistors including four transfer transistors, one amplification transistor, one selection transistor, and one reset transistor (1.75-transistor pixel).

The image pickup device including a photodiode region and a ground region according to each embodiment will be hereinafter specifically described.

First Embodiment (Insulating Isolation)

The following is an explanation about the first example of an image pickup device in which a photodiode region and a ground region are isolated by an isolation insulating film.

Figure 2:
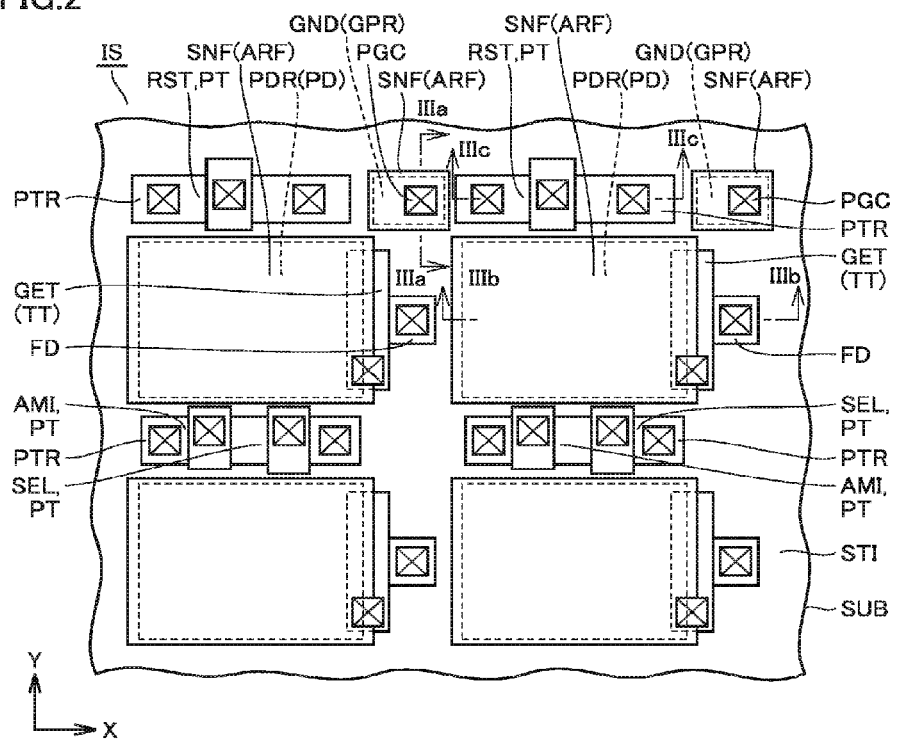
FIG. 2 is a plan view showing the first example of an image pickup device in which isolation is provided by an insulating film, according to the first embodiment.
Figure 3:
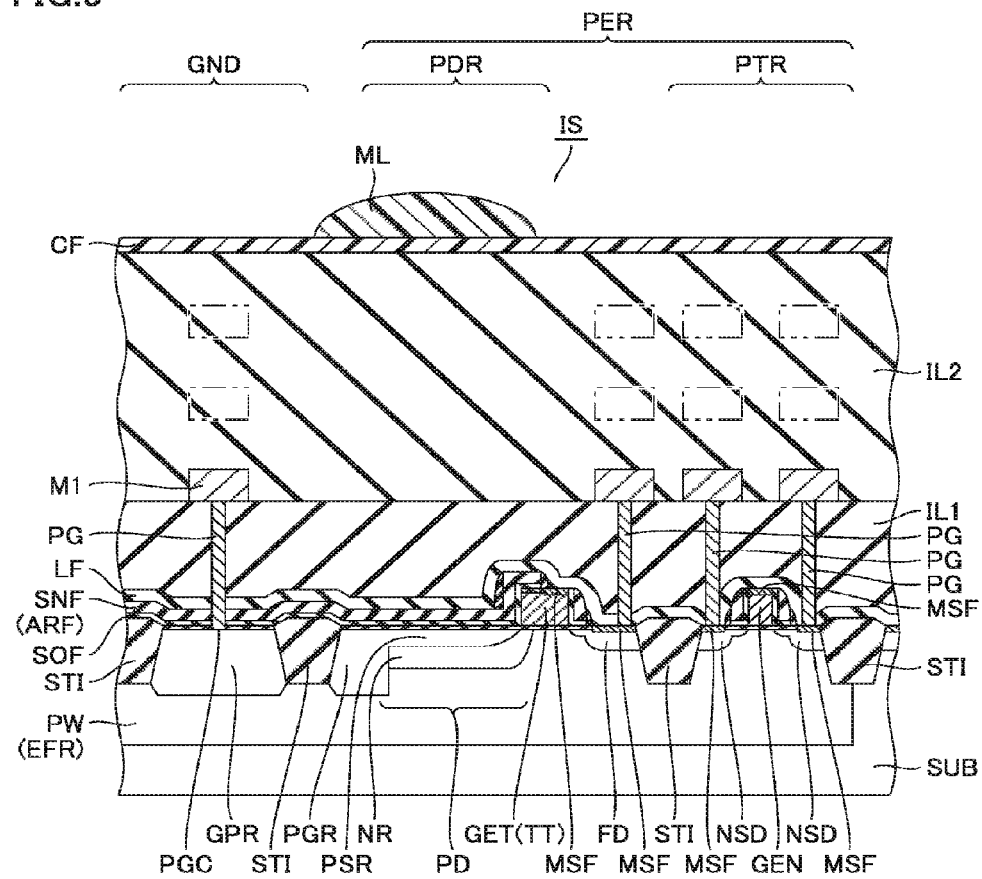
FIG. 3 is a cross-sectional view obtained by connecting cross-sectional views taken along cross-sectional lines IIIa-IIIa, IIIb-IIIb, and IIIc-IIIc, respectively, shown in FIG. 2 according to the first embodiment.

As shown in FIGS. 2 and 3, an insulating film is embedded in a prescribed region in a semiconductor substrate SUB, thereby forming an isolation region STI. A P-type well PW (the first impurity region) as an element formation region is defined by this isolation region STI. Pixel region PER and ground region GND are defined in P-type well PW. In pixel region PER, photodiode region PDR and pixel transistor region PTR are further defined. Amplification transistor AMI, selection transistor SEL or reset transistor RST is formed in pixel transistor region PTR.

A gate electrode GET of transfer transistor TT is formed so as to cross P-type well PW. Photodiode region PDR is formed in a portion of P-type well PW located on one side across gate electrode GET. A floating diffusion region FD is formed in a portion of P-type well PW located on the other side across gate electrode GET. A metal silicide film MSF is formed on the surface of floating diffusion region FD.

Photodiode PD is formed in photodiode region PDR. Photodiode PD includes an N-type impurity region NR. A P-type impurity region PSR is formed on this N-type impurity region NR. Furthermore, a P-type guard ring PGR is formed adjacent to N-type impurity region NR.

Isolation region STI is arranged between photodiode region PDR and ground region GND. Photodiode region PDR and ground region GND are isolated by an insulating film of isolation region STI. P-type guard ring PGR is formed along this isolation region STI.

A P-type impurity region GPR (the second impurity region) is formed in ground region GND. The impurity concentration of the P-type impurity region is set to be higher than the impurity concentration of P-type well PW. P-type impurity region GPR is electrically connected to photodiode PD (anode) through P-type well PW.

A pixel transistor PT is formed in pixel transistor region PTR. In FIG. 3, pixel transistor PT is shown as one transistor as representative of amplification transistor AMI, selection transistor SEL, and reset transistor RST. In pixel transistor region PTR, a gate electrode GEN is formed so as to cross P-type well PW.

An N-type source-drain region NSD is formed in each of a portion of P-type well PW located on one side across gate electrode GEN and a portion of P-type well PW located on the other side across gate electrode GEN. Metal silicide film MSF is formed on the surface of source-drain region NSD.

A silicon oxide film SOF and an antireflection film ARF are formed so as to cover photodiode region PDR and ground region GND. As shown in FIG. 2, antireflection film ARF particularly only has to be formed so as to cover at least each of photodiode region PDR and ground region GND in their entirety. For convenience of explanation and the like, FIG. 3 shows a structure where antireflection film ARF and the like are continuously formed from photodiode region PDR to ground region GND. This antireflection film ARF is formed of a silicon nitride film SNF, for example.

A liner film LF is formed so as to cover antireflection film ARF, gate electrode GEN and the like. A first interlayer insulating film IL1 is formed so as to cover liner film LF. In ground region GND, a plug PG connected to P-type impurity region GPR is formed so as to extend through first interlayer insulating film IL1, antireflection film ARF and the like. In pixel region PER, plug PG connected to floating diffusion region FD and plug PG connected to source-drain region NSD each are formed so as to extend through first interlayer insulating film IL1.

A first wiring line M1 electrically connected to plug PG is formed on first interlayer insulating film IL1. A second interlayer insulating film IL2 is formed so as to cover first wiring line M1. Second interlayer insulating film IL2 is formed of a plurality of layers, between which a plurality of wiring lines (shown by a two-dot chain line) are formed. A color filter CF is formed on this second interlayer insulating film IL2. A microlens ML is formed on this color filter CF. An image pickup device IS according to the first example is configured as described above.

Then, one example of a method of manufacturing image pickup device IS described above will be described.

Figure 4:
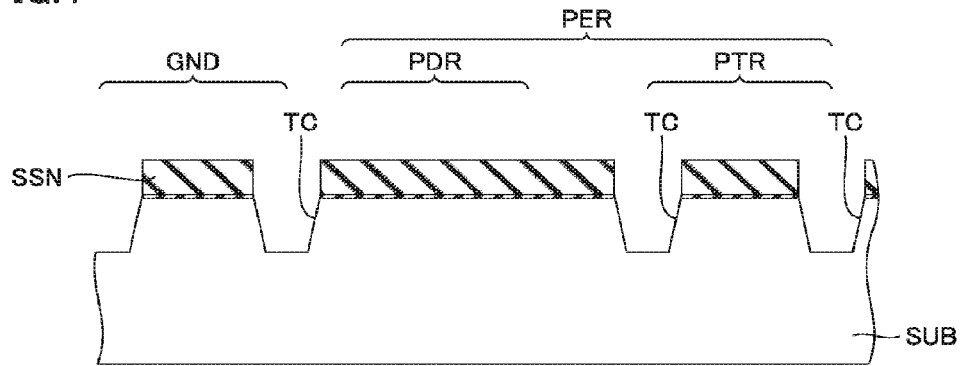
FIG. 4 is a cross-sectional view showing one step of a method of manufacturing the first example of an image pickup device in which isolation is provided by an insulating film, according to the first embodiment.

First, an isolation region in which isolation is provided by an insulating film is formed by a commonly-used method. A silicon nitride film formed so as to cover the surface of the semiconductor substrate is subjected to a prescribed photoengraving process and etching process, thereby forming a mask for forming a trench. Then, as shown in FIG. 4, semiconductor substrate SUB is subjected to an etching process using a silicon nitride film SSN as an etching mask, thereby forming a trench TC.

Figure 5:
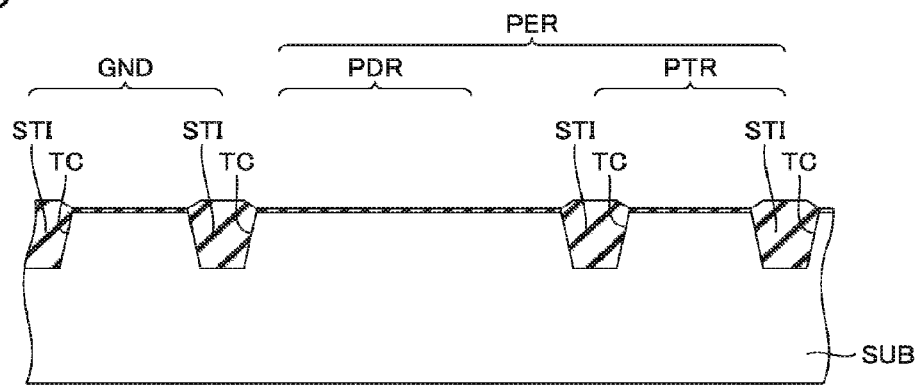
FIG. 5 is a cross-sectional view showing the step carried out after the step shown in FIG. 4 according to the first embodiment.

Then, an insulating film (not shown) such as a silicon oxide film is formed on silicon nitride film SSN such that trench TC is embedded therein. Then, the insulating film is subjected to a chemical mechanical polishing process, which is followed by removal or the like of silicon nitride film SSN. Thereby, isolation region STI in which trench TC is filled with an insulating film is formed as shown in FIG. 5.

Figure 6:
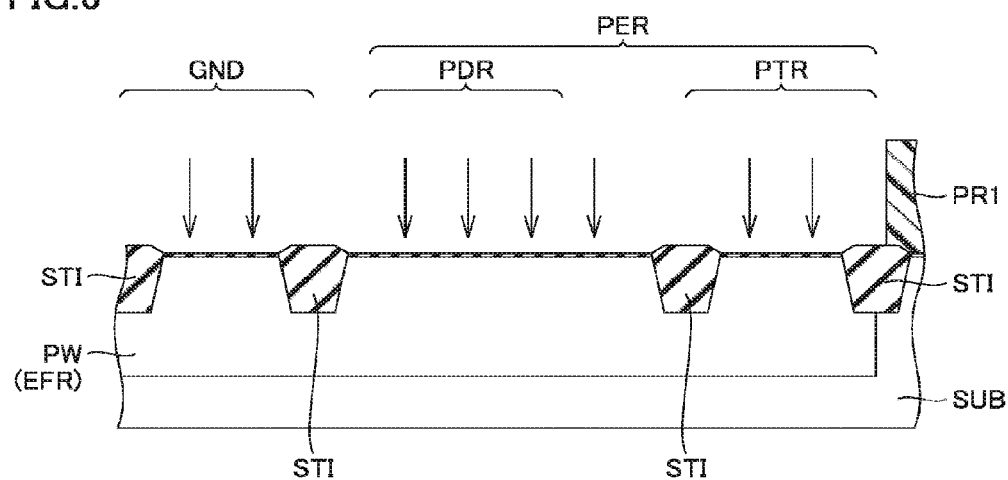
FIG. 6 is a cross-sectional view showing the step carried out after the step shown in FIG. 5 according to the first embodiment.

Then, a prescribed photoengraving process is carried out to thereby expose pixel region PER and ground region GND, so that a photoresist pattern PR1 covering another region is formed as shown in FIG. 6. Then, p-type impurities are implanted using photoresist pattern PR1 as an implantation mask, so that a part of P-type well PW as element formation region EFR is formed. Then, photoresist pattern PR1 is removed.

Figure 7:
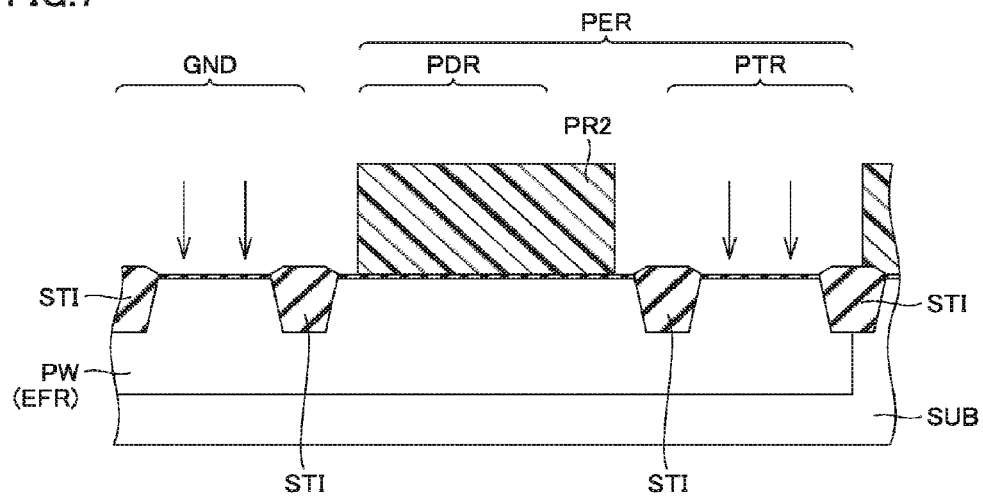
FIG. 7 is a cross-sectional view showing the step carried out after the step shown in FIG. 6 according to the first embodiment.

Then, a prescribed photoengraving process is carried out, thereby forming a photoresist pattern PR2 covering photodiode region PDR and the like, as shown in FIG. 7. Then, p-type impurities are implanted using photoresist pattern PR2 as an implantation mask. This implantation is carried out for preventing crosstalk to adjoining pixels. Then, photoresist pattern PR2 is removed.

Figure 8:
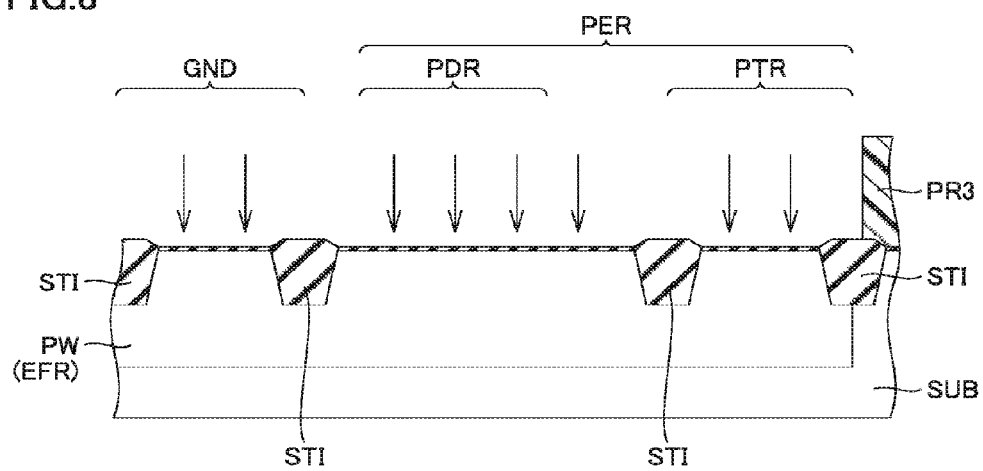
FIG. 8 is a cross-sectional view showing the step carried out after the step shown in FIG. 7 according to the first embodiment.

Then, a prescribed photoengraving process is carried out to thereby expose pixel region PER and ground region GND, so that a photoresist pattern PR3 covering another region is formed as shown in FIG. 8. Then, p-type impurities are implanted using photoresist pattern PR3 as an implantation mask, thereby forming the remaining portion of P-type well PW. Then, photoresist pattern PR3 is removed.

Figure 9:
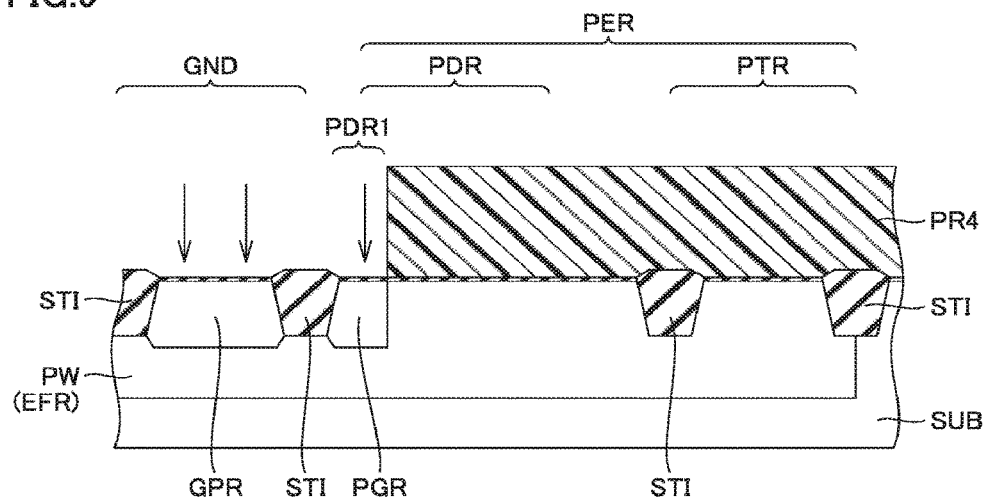
FIG. 9 is a cross-sectional view showing the step carried out after the step shown in FIG. 8 according to the first embodiment.

Then, a prescribed photoengraving process is carried out to thereby expose ground region GND and a region PDR1 corresponding to a part of photodiode region PDR, so that a photoresist pattern PR4 covering another region is formed as shown in FIG. 9. Then, p-type impurities are implanted using photoresist pattern PR4 as an implantation mask, so that P-type impurity region GPR is formed in ground region GND.

In region PDR1 corresponding to a part of photodiode region PDR, P-type guard ring PGR is formed along isolation region STI. This P-type guard ring PGR is formed as a barrier preventing the photodiode from being influenced by electric charge generated on the boundary between isolation region STI and photodiode region PDR. Then, photoresist pattern PR4 is removed.

Figure 10:
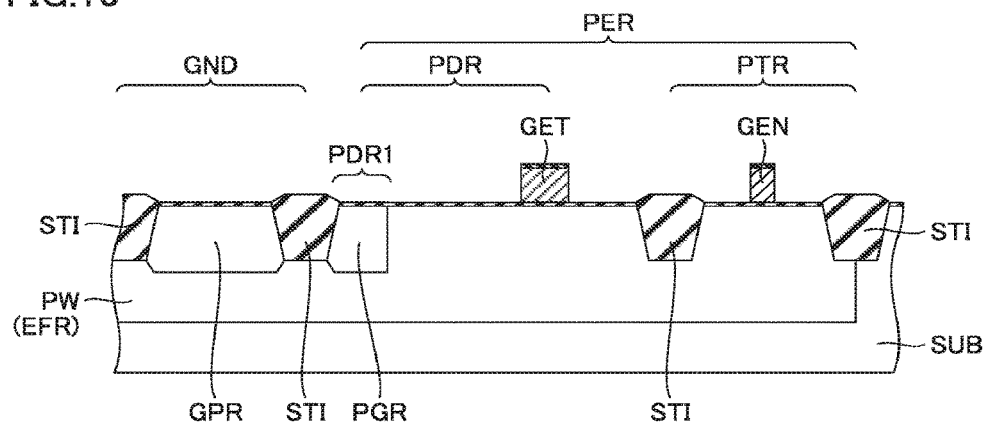
FIG. 10 is a cross-sectional view showing the step carried out after the step shown in FIG. 9 according to the first embodiment.

Then, a conductive film such as a polysilicon film (not shown) serving as a gate electrode and a film (not shown) serving as a hard mask are formed so as to cover the surface of semiconductor substrate SUB. Then, a prescribed photoengraving process and etching process are carried out, thereby forming a hard mask used for patterning a gate electrode. Then, the conductive film is subjected to an etching process using this hard mask and the like as an etching mask. Thereby, gate electrode GET, gate electrode GEN and the like are formed as shown in FIG. 10.

Although the explanation has been given with regard to the case where gate electrode GET and the like are patterned using a hard mask, a hard mask is not necessarily applied for this patterning. For example, a dry etching process may be carried out by using a photoresist pattern as an etching mask, thereby patterning gate electrode GET and the like.

Figure 11:
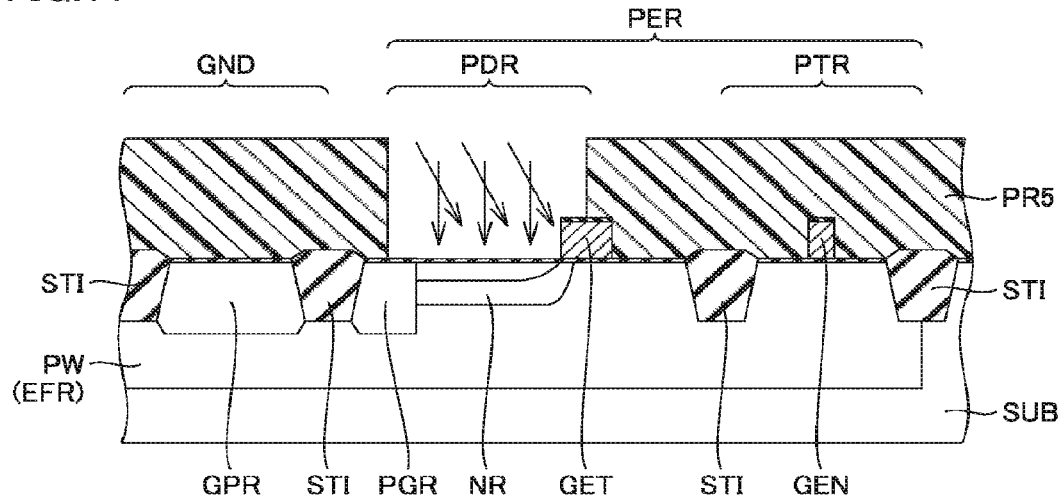
FIG. 11 is a cross-sectional view showing the step carried out after the step shown in FIG. 10 according to the first embodiment.

Then, a prescribed photoengraving process is carried out to thereby expose photodiode region PDR, so that a photoresist pattern PR5 covering another region is formed, as shown in FIG. 11. Then, n-type impurities are implanted using this photoresist pattern PR5 as an implantation mask, thereby forming N-type impurity region NR in a photodiode. Then, photoresist pattern PR5 is removed.

Figure 12:
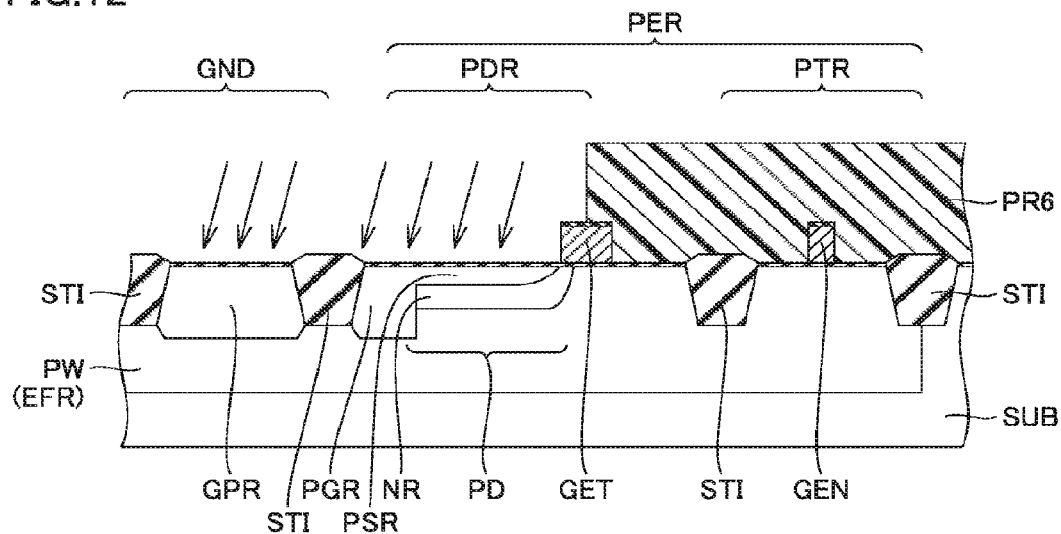
FIG. 12 is a cross-sectional view showing the step carried out after the step shown in FIG. 11 according to the first embodiment.

Then, a prescribed photoengraving process is carried out to thereby expose photodiode region PDR and ground region GND, so that a photoresist pattern PR6 covering another region is formed, as shown in FIG. 12. Then, p-type impurities are implanted using this photoresist pattern PR6 as an implantation mask, thereby forming P-type impurity region PSR having a relatively higher impurity concentration. P-type impurity region PSR is formed in order to protect the surface of the photodiode. In this way, photodiode PD is formed in photodiode region PDR. Then, photoresist pattern PR6 is removed.

Figure 13:
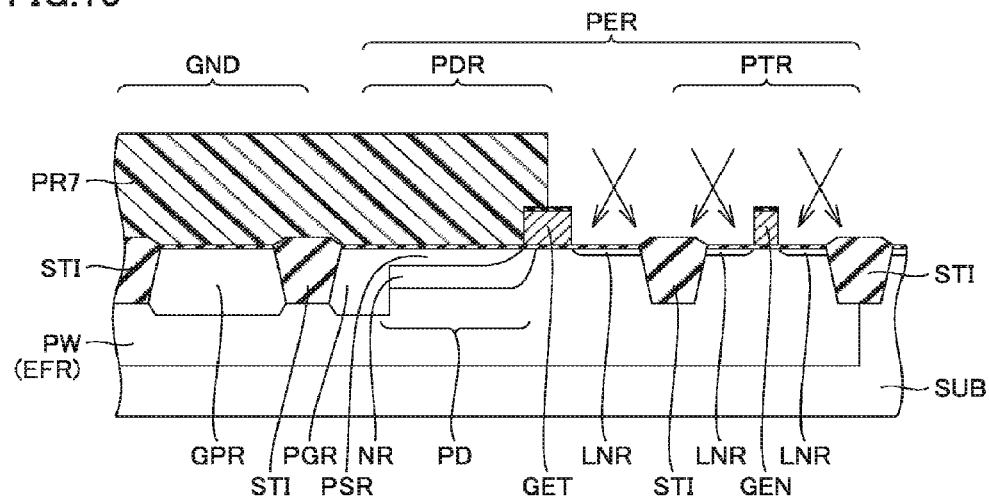
FIG. 13 is a cross-sectional view showing the step carried out after the step shown in FIG. 12 according to the first embodiment.

Then, a prescribed photoengraving process is carried out to thereby expose pixel transistor region PTR and the like, so that a photoresist pattern PR7 covering photodiode region PDR and ground region GND is formed, as shown in FIG. 13. Then, n-type impurities are implanted using this photoresist pattern PR7 as an implantation mask, thereby forming an N-type impurity region LNR as an LDD (Lightly Doped Drain) region. Then, photoresist pattern PR7 is removed.

Figure 14:
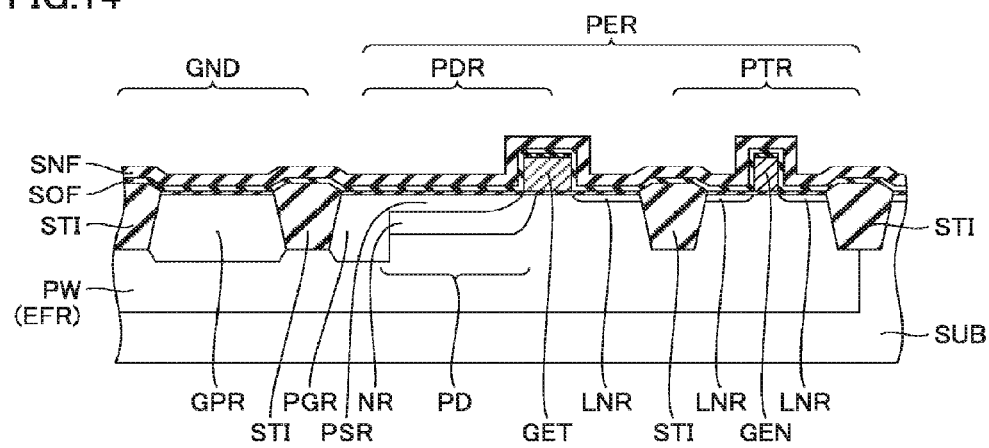
FIG. 14 is a cross-sectional view showing the step carried out after the step shown in FIG. 13 according to the first embodiment.

Then, a silicon oxide film SOF is formed as a spacer, for example, by the CVD (Chemical Vapor Deposition) method or the like so as to cover gate electrodes GET, GEN and the like, as shown in FIG. 14. Then, silicon nitride film SNF serving as an antireflection film is formed so as to cover this silicon oxide film SOF. Although the explanation has been made with regard to the case where silicon nitride film SNF is formed on silicon oxide film SOF, this order can be changed, so that silicon oxide film SOF may be formed on silicon nitride film SNF.

Figure 15:
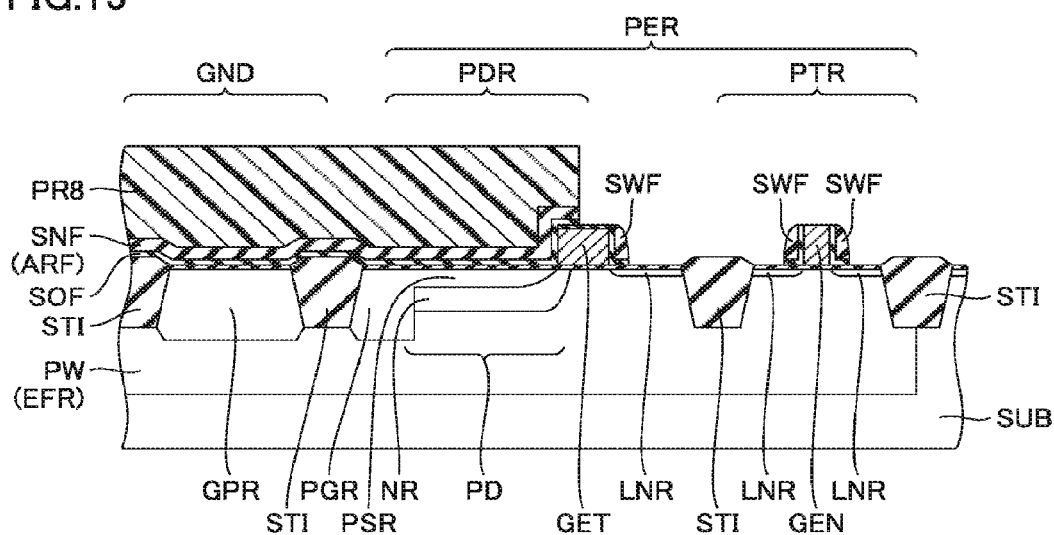
FIG. 15 is a cross-sectional view showing the step carried out after the step shown in FIG. 14 according to the first embodiment.

Then, a prescribed photoengraving process is carried out to cover photodiode region PDR and ground region GND, thereby forming a photoresist pattern PR8 through which pixel transistor region PTR and the like are exposed, as shown in FIG. 15. Then, silicon nitride film SNF and the like are subjected to an etching process using this photoresist pattern PR8 as an etching mask.

By this etching process, antireflection film ARF covering at least the entire photodiode region PDR and the entire ground region GND is formed. Furthermore, a sidewall insulating film SWF is formed on the side surface of each of gate electrode GET and gate electrode GEN. Then, photoresist pattern PR8 is removed.

Figure 16:
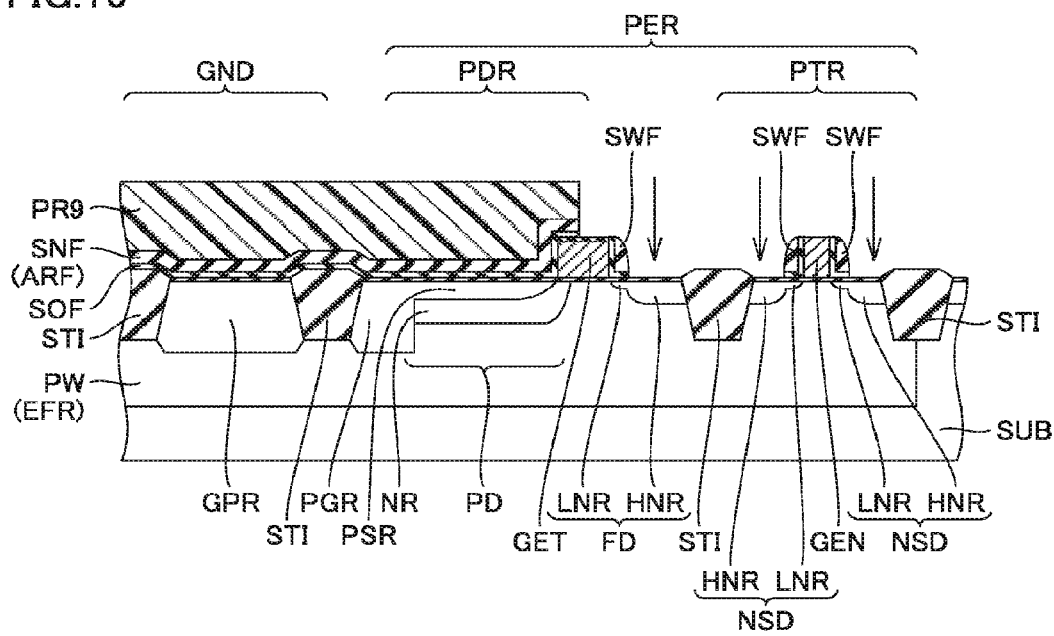
FIG. 16 is a cross-sectional view showing the step carried out after the step shown in FIG. 15 according to the first embodiment.

Then, a prescribed photoengraving process is carried out to cover photodiode region PDR and ground region GND, thereby forming a photoresist pattern PR9 through which pixel transistor region PTR and the like are exposed, as shown in FIG. 16. Then, n-type impurities are implanted using this photoresist pattern PR9 as an implantation mask, thereby forming an N-type impurity region HNR.

Thereby, floating diffusion region FD is formed adjacent to gate electrode GET by N-type impurity region LNR and N-type impurity region HNR. Furthermore, in pixel transistor region PTR, a pair of source-drain regions NSD is formed by N-type impurity region LNR and N-type impurity region HNR. Then, photoresist pattern PR9 is removed.

Figure 17:
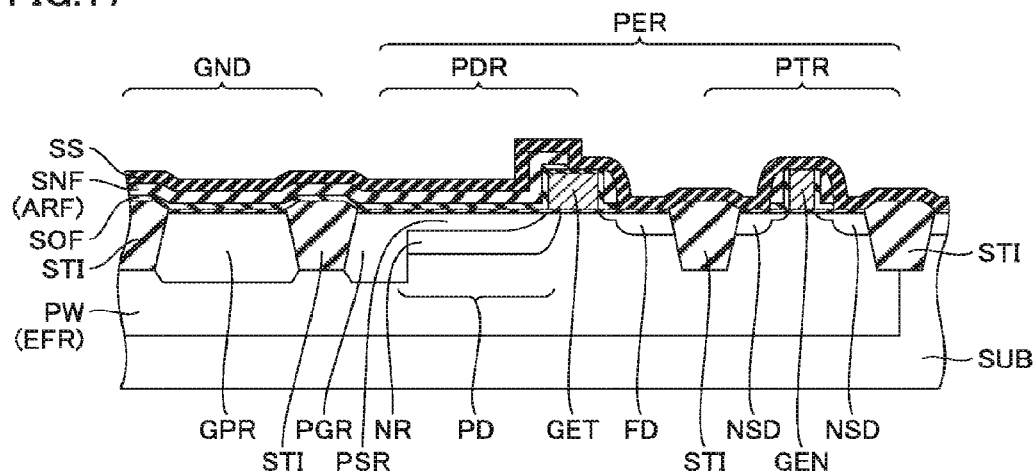
FIG. 17 is a cross-sectional view showing the step carried out after the step shown in FIG. 16 according to the first embodiment.
Figure 18:
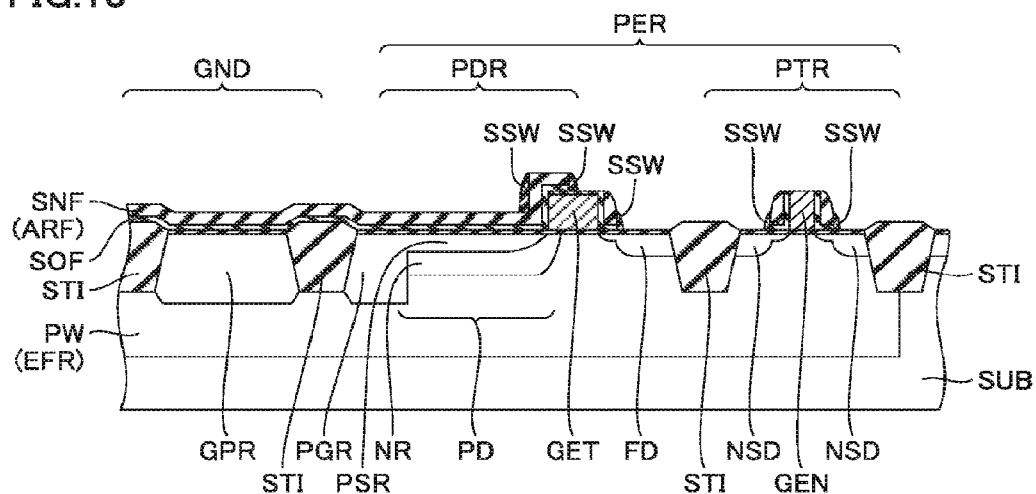
FIG. 18 is a cross-sectional view showing the step carried out after the step shown in FIG. 17 according to the first embodiment.

Then, a silicon oxide film SS is formed, for example, by the CVD method so as to cover antireflection film ARF and the like, as shown in FIG. 17. Then, the entire surface of silicon oxide film SS is subjected to an anisotropic etching process, so that a side wall oxide film SSW is formed on gate electrode GET, its sidewall side and the like, as shown in FIG. 18.

Figure 19:
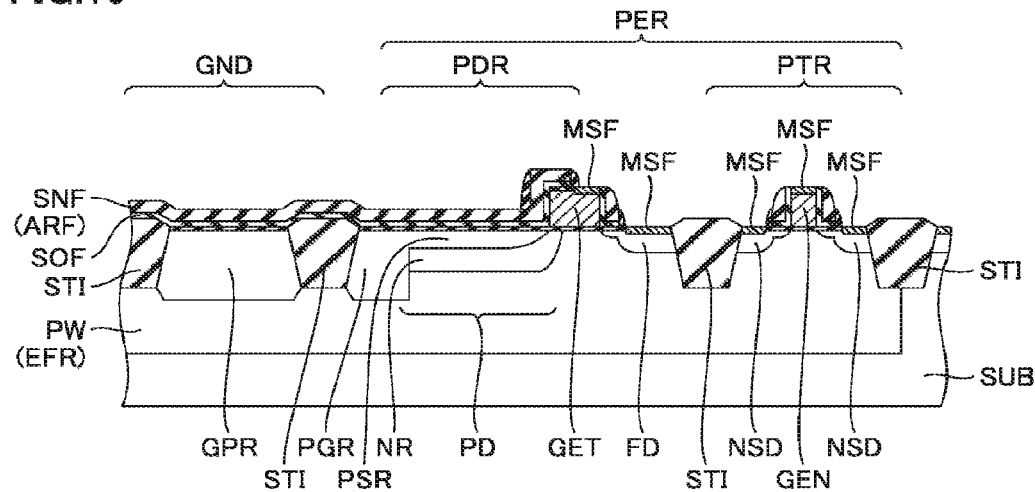
FIG. 19 is a cross-sectional view showing the step carried out after the step shown in FIG. 18 according to the first embodiment.

Then, a metal silicide film MSF is formed by the salicide (Self Aligned siliCIDE) method on a part of the upper surface of gate electrode GET and the surface of floating diffusion region FD, as shown in FIG. 19. Metal silicide film MSF is also formed on the upper surface of gate electrode GEN and the surface of source-drain region NSD.

Figure 20:
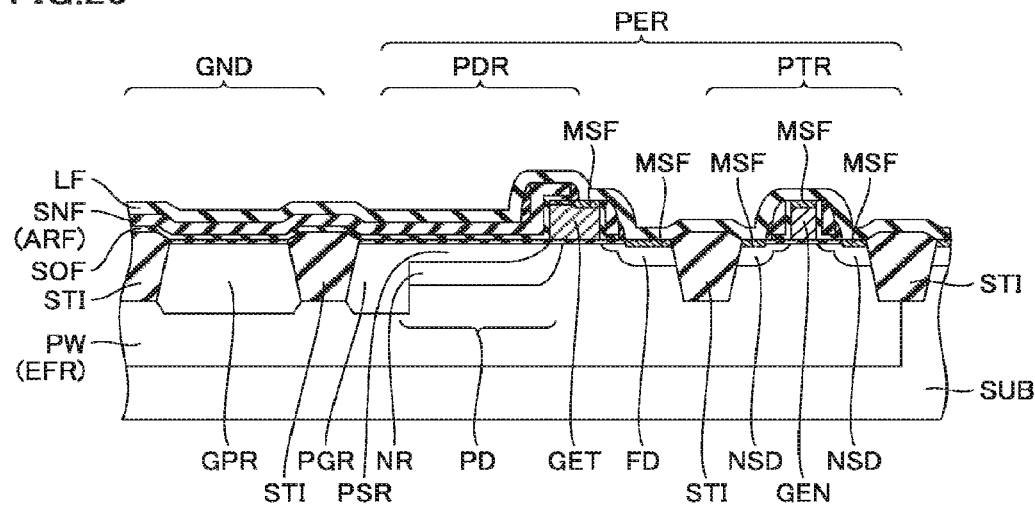
FIG. 20 is a cross-sectional view showing the step carried out after the step shown in FIG. 19 according to the first embodiment.

Then, a liner film LF made of a silicon nitride film is formed, for example, by the CVD method so as to cover antireflection film ARF and the like, as shown in FIG. 20. Then, first interlayer insulating film IL1 made of a TEOS (Tetra Ethyl OrthoSilicate) film and the like is formed, for example, by the CVD method so as to cover liner film LF, as shown in FIG. 21.

Then, a prescribed photoengraving process is carried out to thereby form a photoresist pattern (not shown) used for forming a contact hole. Then, first interlayer insulating film IL1 is subjected to an etching process using this photoresist pattern as an etching mask.

Figure 21:
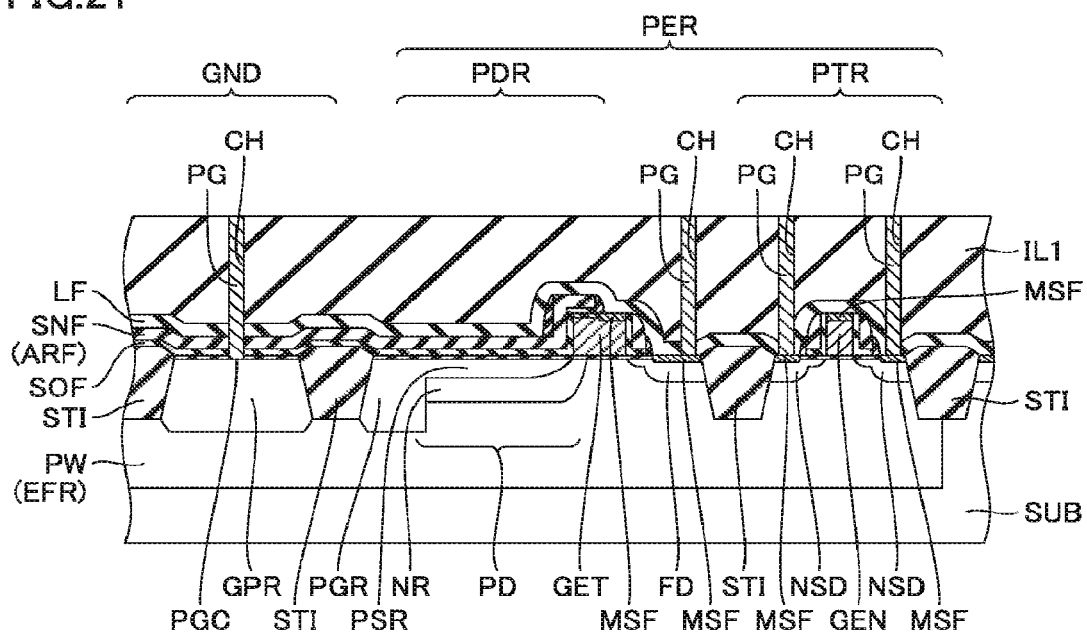
FIG. 21 is a cross-sectional view showing the step carried out after the step shown in FIG. 20 according to the first embodiment.

Thereby, ground region GND is provided with contact hole CH through which P-type impurity region GPR located in ground region GND is exposed (see FIG. 21). This contact hole CH extends through first interlayer insulating film IL1, liner film LF, antireflection film ARF, and the like.

Furthermore, pixel region PER is also provided with: contact hole CH through which floating diffusion region FD is exposed (see FIG. 21); and contact hole CH through which source-drain region NSD is exposed (see FIG. 21). Both contact holes CH extend through first interlayer insulating film IL1, liner film LF, antireflection film ARF, and the like.

Then, a barrier metal and a tungsten film (neither of which is shown) are formed on first interlayer insulating film IL1 such that a contact hole is embedded therein. Then, a chemical mechanical polishing process is carried out, thereby removing portions of the barrier metal and the tungsten film that are located on the upper surface of first interlayer insulating film IL1, so that first interlayer insulating film IL1 is further flattened. Thereby, plug PG is formed inside contact hole CH as shown in FIG. 21.

Then, a commonly-used film-forming process, etching process and the like are repeated, so that a plurality of wiring lines (shown by a two-dot chain line) including first wiring line M1 are formed in second interlayer insulating film IL2. Aluminum or copper is used as a material of a wiring line such as first wiring line M1. In the case where copper is used as a material, a wiring line is to be formed by a damascene process.

Figure 22:
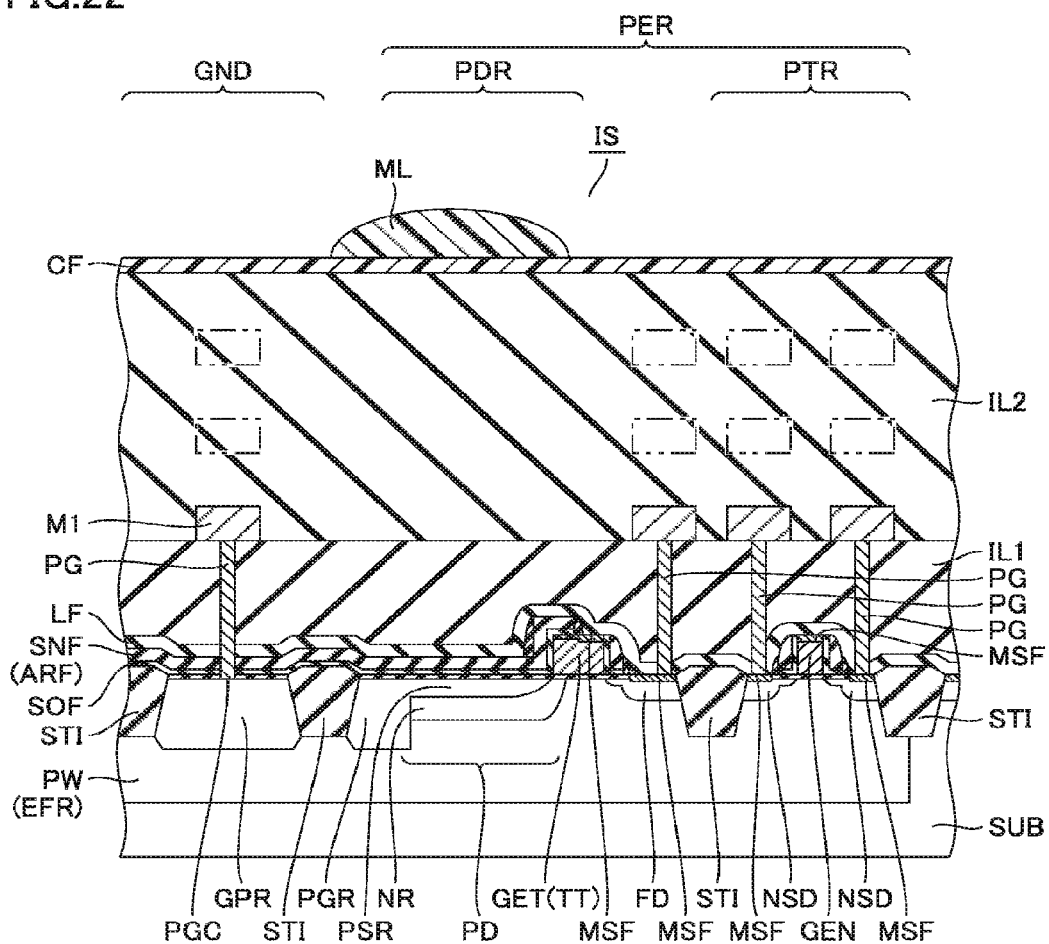
FIG. 22 is a cross-sectional view showing the step carried out after the step shown in FIG. 21 according to the first embodiment.

When these wiring lines are formed, a heat treatment (hydrogen sintering) is to be carried out in a hydrogen atmosphere. As will be describes later, hydrogen sintering causes hydrogen to combine with the dangling bond of silicon, so that the dangling bond is terminated. Then, as shown in FIG. 22, color filter CF and microlens ML are formed, so that a main part of image pickup device IS is completed.

In image pickup device IS in which isolation is provided by an insulating film as described above, antireflection film ARF made of a silicon nitride film is formed so as to cover at least each of the entire photodiode region PDR and the entire ground region GND, so that a dark current can be suppressed. This will be hereinafter described as compared with an image pickup device according to a comparative example.

Figure 23:
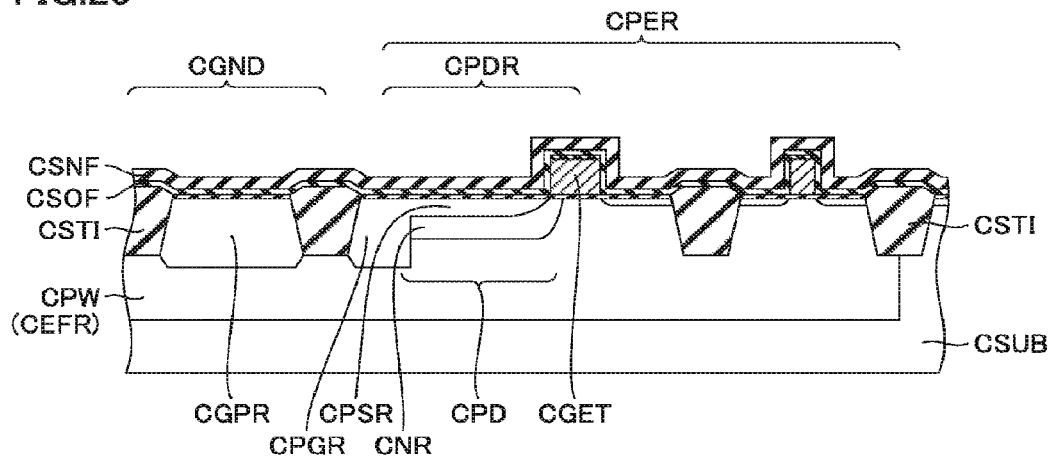
FIG. 23 is a cross-sectional view showing one step of a method of manufacturing an image pickup device according to a comparative example.

First, main steps of the method of manufacturing an image pickup device in which isolation is provided by an insulating film according to the comparative example will be hereinafter described. Through the steps similar to those shown in FIGS. 4 to 14 as described above, an isolation region CSTI, an element formation region CEFR, a P-type well CPW, a photodiode CPD including an N-type impurity region CNR, a P-type impurity region CPSR, a P-type guard ring CPGR, a P-type impurity region CGPR, a gate electrode CGET, and the like are formed in semiconductor substrate CSUB, as shown in FIG. 23. A silicon oxide film CSOI is formed so as to cover gate electrode CGET and the like. Then, a silicon nitride film CSNF is formed so as to cover this silicon oxide film CSOI.

Figure 24:
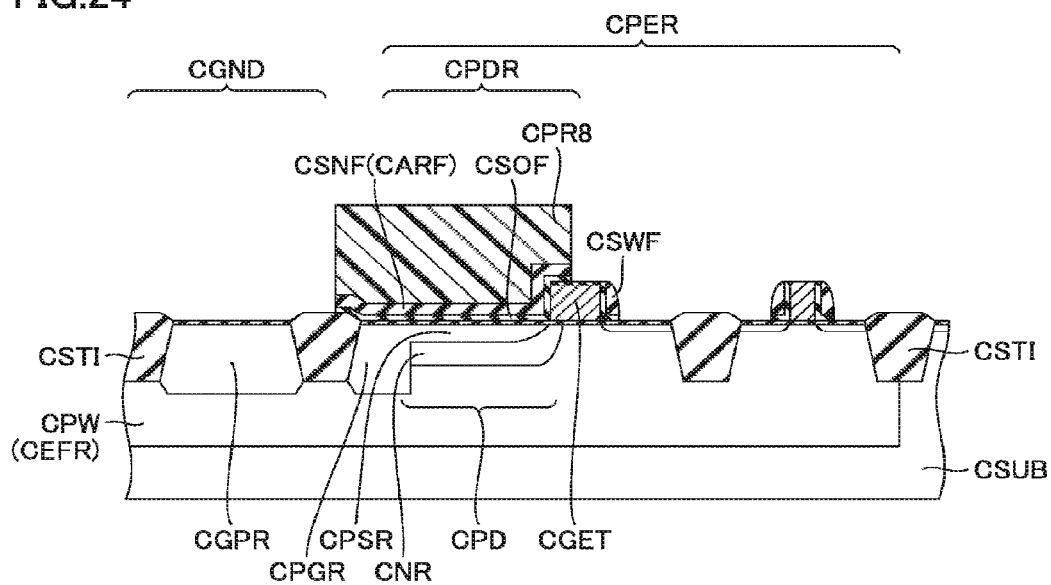
FIG. 24 is a cross-sectional view showing the step carried out after the step shown in FIG. 23.

Then, a prescribed photoengraving process is carried out to thereby form a photoresist pattern CPR8 covering a photodiode region CPDR, as shown in FIG. 24. Then, silicon nitride film CSNF is subjected to an etching process using this photoresist pattern CPR8 as an etching mask, so that a portion of silicon nitride film CSNF that is located in photodiode region CPDR is formed as an antireflection film CARF.

Figure 25:
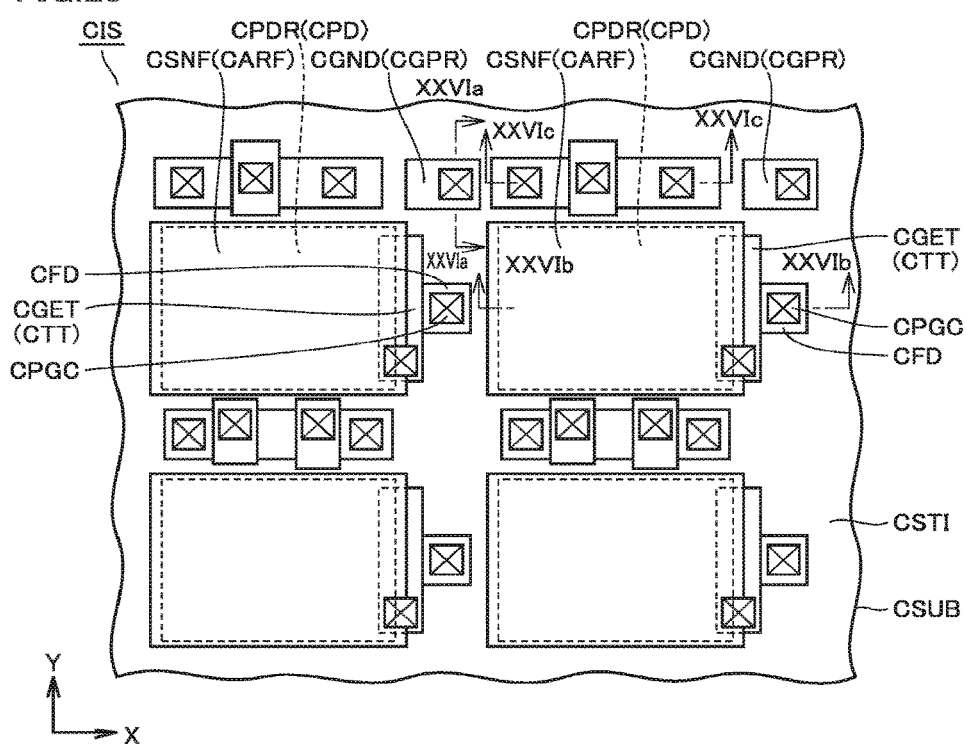
FIG. 25 is a plan view showing the step carried out after the step shown in FIG. 24, which illustrates an image pickup device in which a main part is completed.
Figure 26:
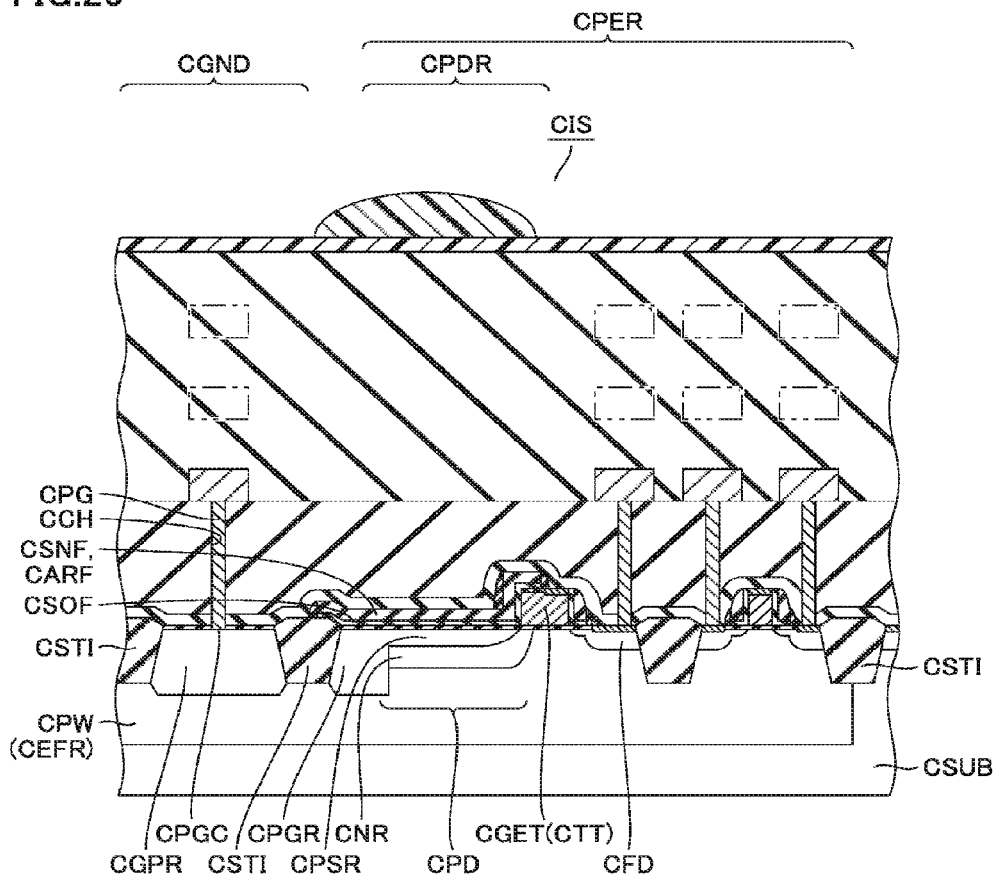
FIG. 26 a cross-sectional view obtained by connecting cross-sectional views taken along cross-sectional lines XXVIa-XXVIa, XXVIb-XXVIb, and XXVIc-XXVIc, respectively, shown in FIG. 25.

Then, photoresist pattern CPR8 is removed, and the steps similar to those shown in FIGS. 16 to 22 described above are carried out, thereby completing a main part of image pickup device CIS in which isolation is provided by an insulating film according to the comparative example, as shown in FIGS. 25 and 26.

In image pickup device CIS according to the comparative example, when antireflection film CARF is formed, an etching process is performed on a portion of exposed silicon nitride film CSNF that is not covered by photoresist while leaving a portion of silicon nitride film CSNF that is covered by photoresist pattern CPR8, as shown in FIG. 24.

When the exposed silicon nitride film CSNF is subjected to an etching process, plasma damage may occur in photodiode region CPDR. Particularly when an etching process is performed on a portion of silicon nitride film CSNF that is located in ground region CGND, plasma damage is more likely to occur in photodiode region CPDR.

This will be hereinafter explained. Ground region CGND is arranged in the vicinity of photodiode region CPDR. A contact hole CCH (see FIG. 26) is formed in this ground region CGND such that ground region CGND is exposed therethrough. A plug CPG (see FIG. 26) is formed in contact hole CCH for electrically connecting the anode of photodiode CPD to a ground potential.

Accordingly, when antireflection film CARF is formed, at least a portion having contact hole CCH formed therein and a portion of silicon nitride film CSNF located therearound are simultaneously removed by the etching process such that plug CPG is reliably connected to ground region CGND. In addition, the entire ground region CGND is removed in this comparative example in which isolation is provided by an insulating film.

Since this ground region CGND is arranged in the vicinity of photodiode region CPDR, plasma damage resulting from the etching process is more likely to occur in photodiode region CPDR. It was confirmed by the inventor's evaluation that a dark current is generated in photodiode CPD when etching damage occurs in photodiode region CPDR.

In contrast to image pickup device CIS according to the comparative example, in image pickup device IS according to the present embodiment, photoresist pattern PR8 is formed so as to also cover at least ground region GND in addition to photodiode region PDR as shown in FIG. 16 when antireflection film ARF is formed.

Accordingly, an etching process is not carried out on the portion of silicon nitride film SNF that is located in ground region GND arranged in the vicinity of photodiode region PDR. Thus, as compared with image pickup device CIS according to the comparative example, plasma damage resulting from an etching process can be suppressed from occurring in photodiode region CPDR.

Furthermore, in image pickup device IS according to the present embodiment, silicon nitride film SNF serving as an antireflection film is patterned so as to cover at least photodiode region PDR and ground region GND while portions of silicon nitride film SNF that are located in other regions are removed. It was clarified by the inventor that this structure also contributes to suppression of generation of a dark current in photodiode PD.

This will be hereinafter explained. According to image pickup device IS, it is known that a dangling bond (uncombined hand) caused by disconnection of coupling exists in silicon located on the surface of crystalline semiconductor substrate SUB. Silicon having a dangling bond causes a leakage path of a leakage current. Since the dark current generated in photodiode PD is a minute leakage current, the existence of silicon having a dangling bond leading to a leakage path cannot be negligible.

Accordingly, further suppression of a dark current requires reduction of dangling bonds of silicon in addition to reduction of etching damage. Examples of the method of reducing a dangling bond as an uncombined hand includes a method of combining hydrogen (H atom) with a dangling bond. In a series method of manufacturing an image pickup device IS according to the present embodiment, a heat treatment (hydrogen sintering) is carried out in a hydrogen atmosphere when a wiring line is formed. This heat treatment leads to supply of hydrogen that causes the dangling bond of silicon to be terminated.

However, silicon nitride film SNF serving as antireflection film is to consequently prevent hydrogen from reaching the dangling bond of silicon. In image pickup device IS according to the present embodiment, silicon nitride film SNF serving as its antireflection film is formed so as to cover at least photodiode region PDR and ground region GND while a portion of silicon nitride film SNF located in a region other than that is removed.

Thereby, as compared with the structure where the silicon nitride film serving as an antireflection film is remained so as to also cover regions other than photodiode region PDR and ground region GND, hydrogen is more likely to reach the dangling bond of silicon, so that the dangling bond can be terminated. It was clarified by the inventor that a dark current in photodiode PD can consequently be further reduced.

(Pn Isolation)

The following is an explanation about the first example of an image pickup device in which a photodiode region and a ground region are pn-isolated by a pn junction.

Figure 27:
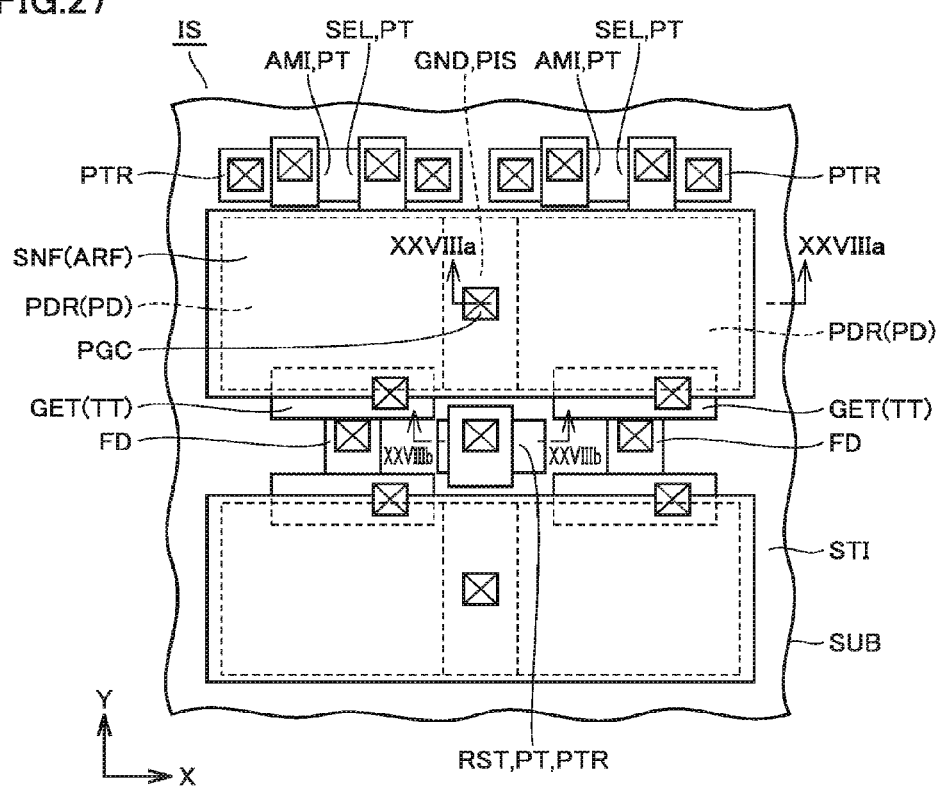
FIG. 27 is a plan view showing the first example of an image pickup device in which pn isolation is provided by a pn junction, according to the first embodiment.
Figure 28:
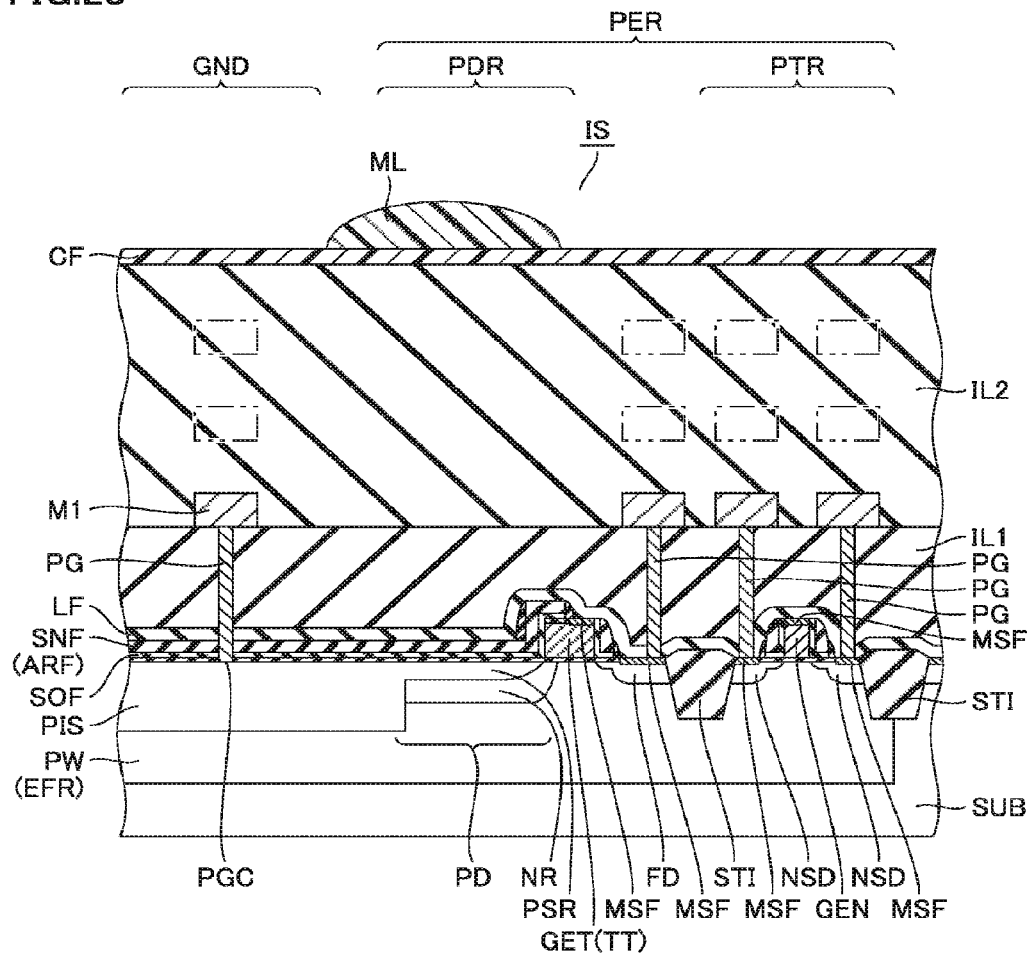
FIG. 28 is a cross-sectional view obtained by connecting cross-sectional views taken along cross-sectional lines XXVIIIa-XXVIIIa and XXVIIIb-XXVIIIb, respectively, shown in FIG. 27 according to the first embodiment.

As shown in FIGS. 27 and 28, photodiode region PDR and ground region GND are arranged adjacent to each other. Photodiode region PDR and ground region GND are pn-isolated by a junction between an N-type impurity region NR of photodiode PD and a P-type impurity region PIS (the fifth impurity region) of ground region GND.

Silicon nitride film SNF serving as antireflection film ARF is formed so as to cover at least photodiode region PDR and ground region GND. Since the configuration other than the above is similar to that of image pickup device IS shown in each of FIGS. 2 and 3, the same components are designated by the same reference characters, and description thereof will not be repeated unless otherwise required.

Then, an example of the method of manufacturing an image pickup device IS in which pn isolation is provided by a pn junction described above will be hereinafter described. This method is substantially the same as the method of manufacturing an image pickup device in which isolation is provided by an insulating film described above, except that an isolation region is not formed between photodiode region PDR and ground region GND. Accordingly, the same components are designated by the same reference characters, and briefly described.

Figure 29:
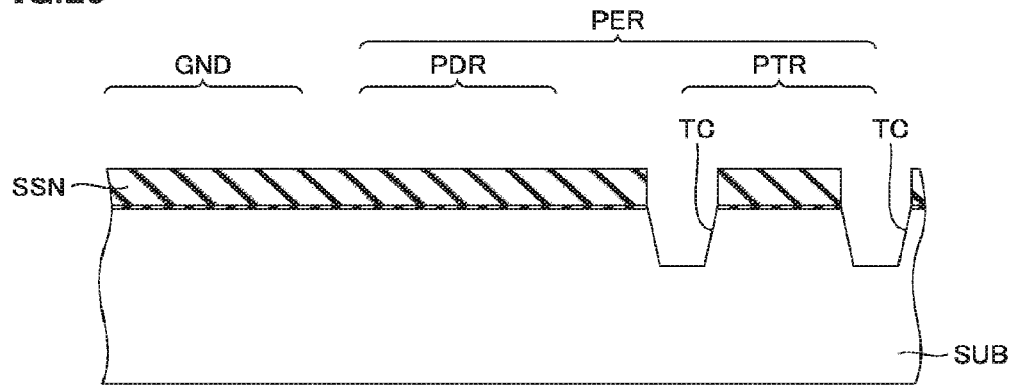
FIG. 29 is a cross-sectional view showing one step of a method of manufacturing the first example of an image pickup device in which pn isolation is provided by a pn junction, according to the first embodiment.
Figure 30:
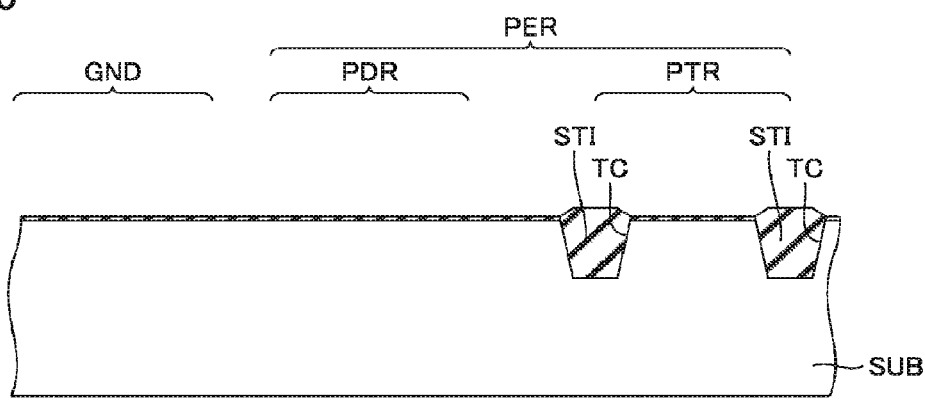
FIG. 30 is a cross-sectional view showing the step carried out after the step shown in FIG. 29 according to the first embodiment.
Figure 31:
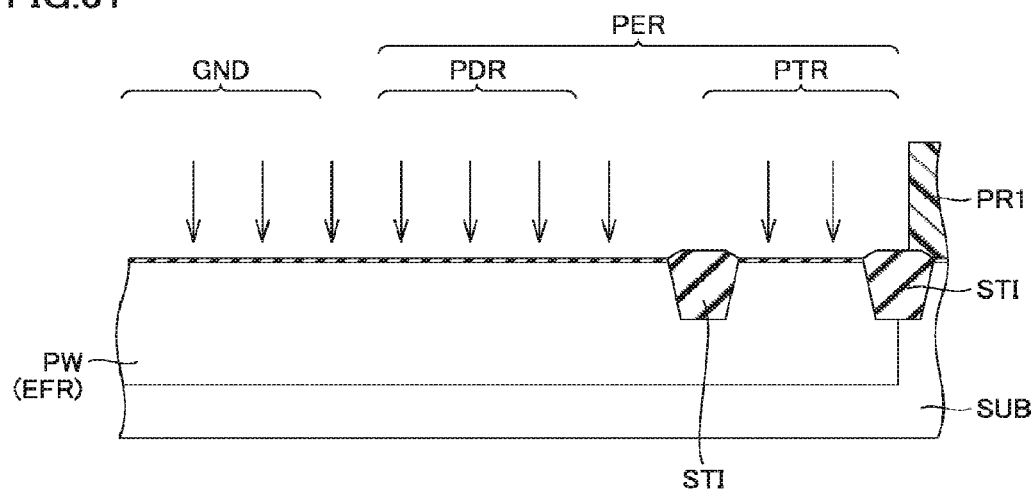
FIG. 31 is a cross-sectional view showing the step carried out after the step shown in FIG. 30 according to the first embodiment.
Figure 32:
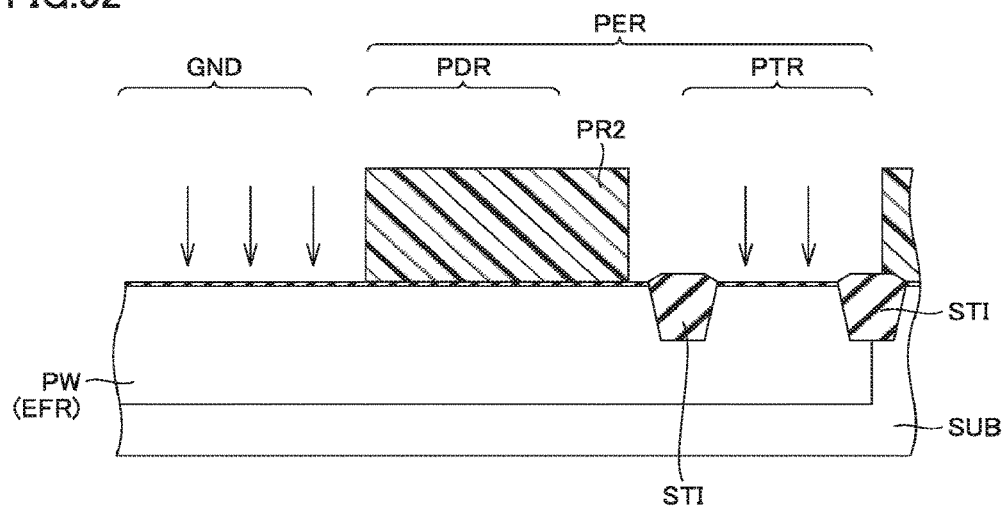
FIG. 32 is a cross-sectional view showing the step carried out after the step shown in FIG. 31 according to the first embodiment.
Figure 33:
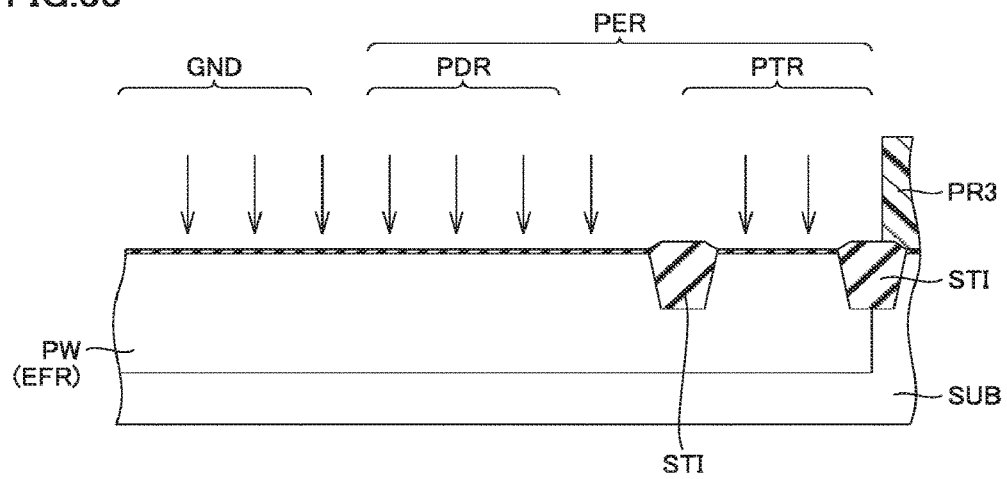
FIG. 33 is a cross-sectional view showing the step carried out after the step shown in FIG. 32 according to the first embodiment.

First, trench TC is formed in a prescribed region as shown in FIG. 29. At this time, a trench is not formed between photodiode region PDR and ground region GND. Then, isolation region STI is formed as shown in FIG. 30. Then, a part of P-type well PW is formed by implanting p-type impurities as shown in FIG. 31. Then, p-type impurities for preventing crosstalk are implanted as shown in FIG. 32. Then, a remaining portion of P-type well PW is formed by further implanting p-type impurities, as shown in FIG. 33.

Figure 34:
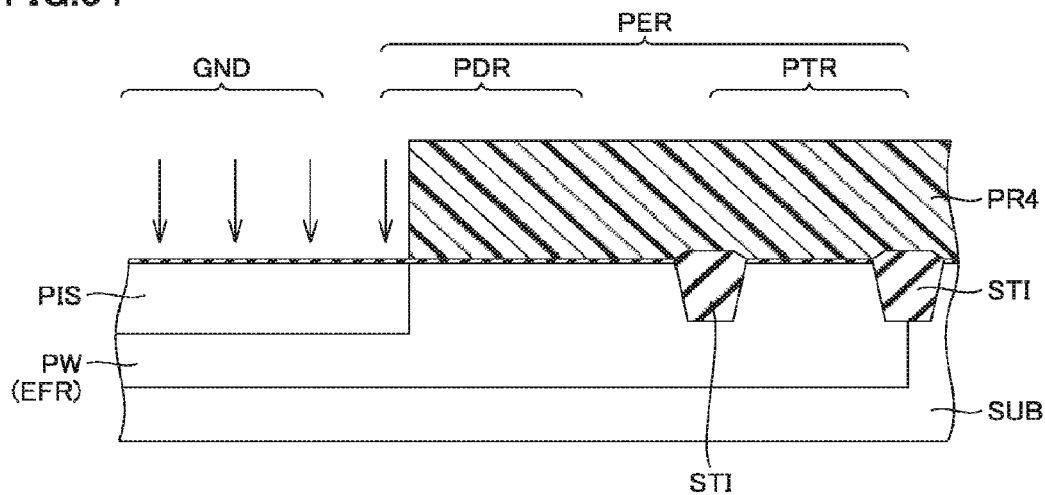
FIG. 34 is a cross-sectional view showing the step carried out after the step shown in FIG. 33 according to the first embodiment.

Then, a prescribed photoengraving process is carried out to thereby expose ground region GND, so that photoresist pattern PR4 covering photodiode region PDR is formed, as shown in FIG. 34. Then, p-type impurities are implanted using this photoresist pattern PR4 as an implantation mask, so that P-type impurity region PIS having a relatively higher impurity concentration is formed in ground region GND. Then, photoresist pattern PR4 is removed.

Figure 35:
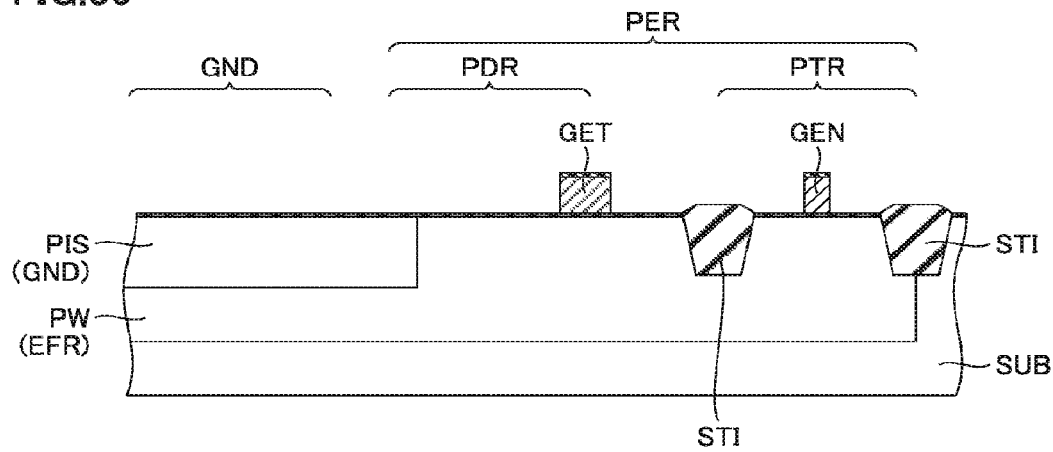
FIG. 35 is a cross-sectional view showing the step carried out after the step shown in FIG. 34 according to the first embodiment.
Figure 36:
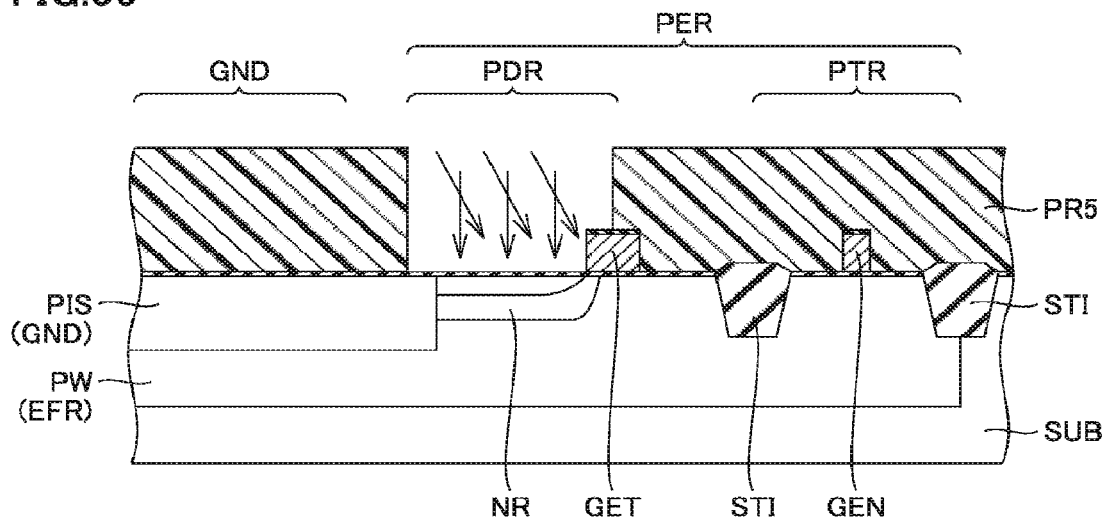
FIG. 36 is a cross-sectional view showing the step carried out after the step shown in FIG. 35 according to the first embodiment.

Then, gate electrode GET of the transfer transistor and gate electrode GEN of the pixel transistor are formed as shown in FIG. 35. Then, N-type impurity region NR serving as a photodiode is formed in photodiode region PDR, as shown in FIG. 36. Thereby, photodiode region PDR and ground region GND are pn-isolated by a pn junction between N-type impurity region NR and P-type impurity region PIS.

Figure 37:
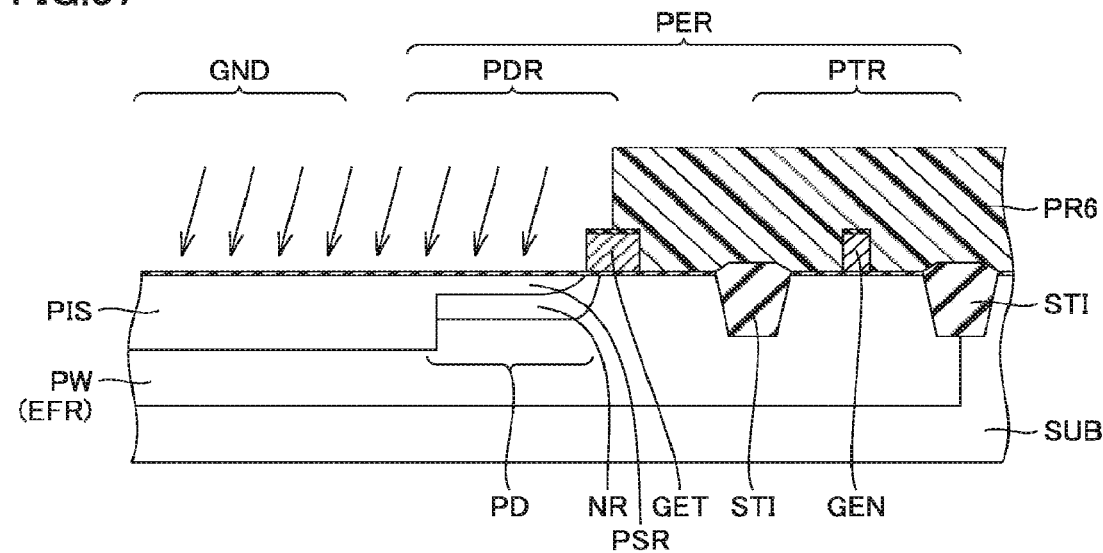
FIG. 37 is a cross-sectional view showing the step carried out after the step shown in FIG. 36 according to the first embodiment.
Figure 38:
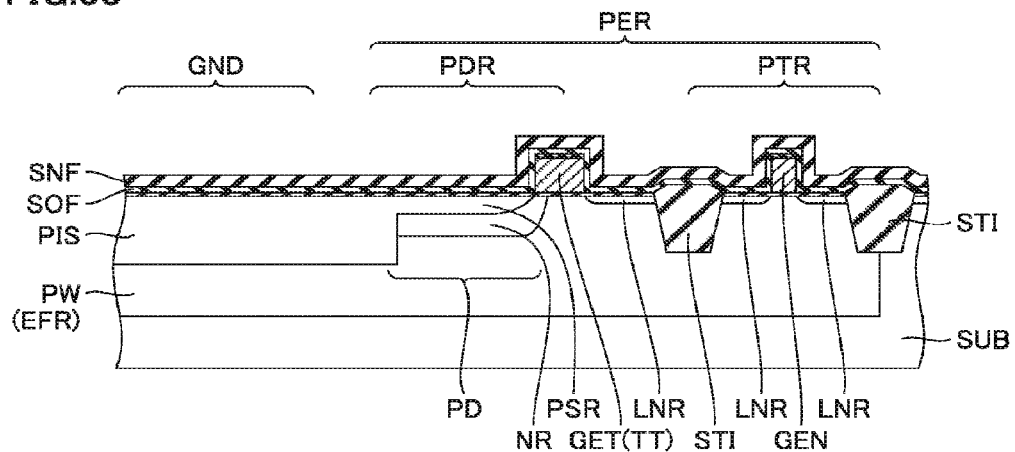
FIG. 38 is a cross-sectional view showing the step carried out after the step shown in FIG. 37 according to the first embodiment.

Then, p-type impurities are implanted, thereby forming P-type impurity region PSR having a relatively higher impurity concentration, as shown in FIG. 37. Then, N-type impurity region LNR as an LDD region is formed as shown in FIG. 38. Then, silicon oxide film SOF is formed so as to cover gate electrodes GET, GEN and the like, on which silicon nitride film SNF serving as an antireflection film is further formed.

Figure 39:
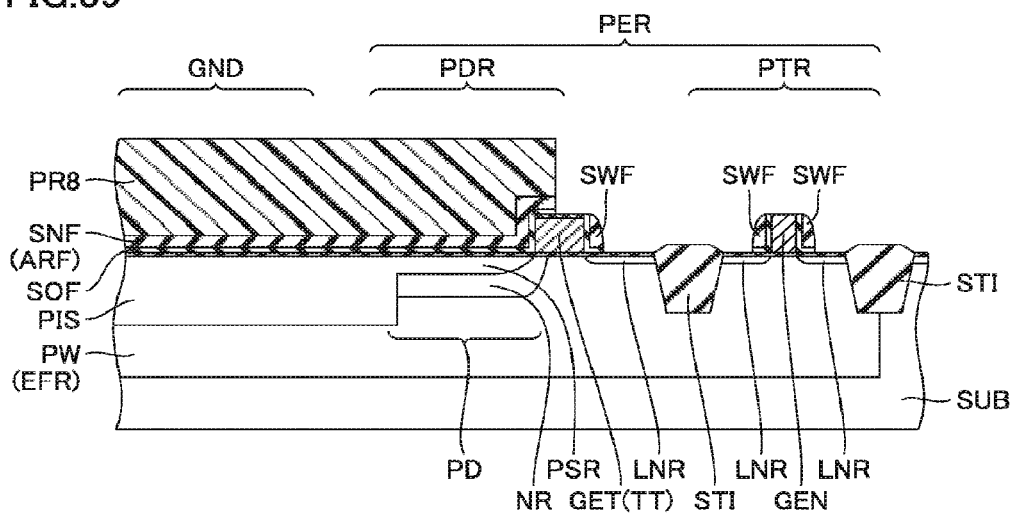
FIG. 39 is a cross-sectional view showing the step carried out after the step shown in FIG. 38 according to the first embodiment.

Then, a prescribed photoengraving process is carried out to thereby cover photodiode region PDR and ground region GND, so that photoresist pattern PR8 is formed, through which pixel transistor region PTR and the like are exposed, as shown in FIG. 39. Then, silicon nitride film SNF and the like are subjected to an etching process using this photoresist pattern PR8 as an etching mask.

Figure 40:
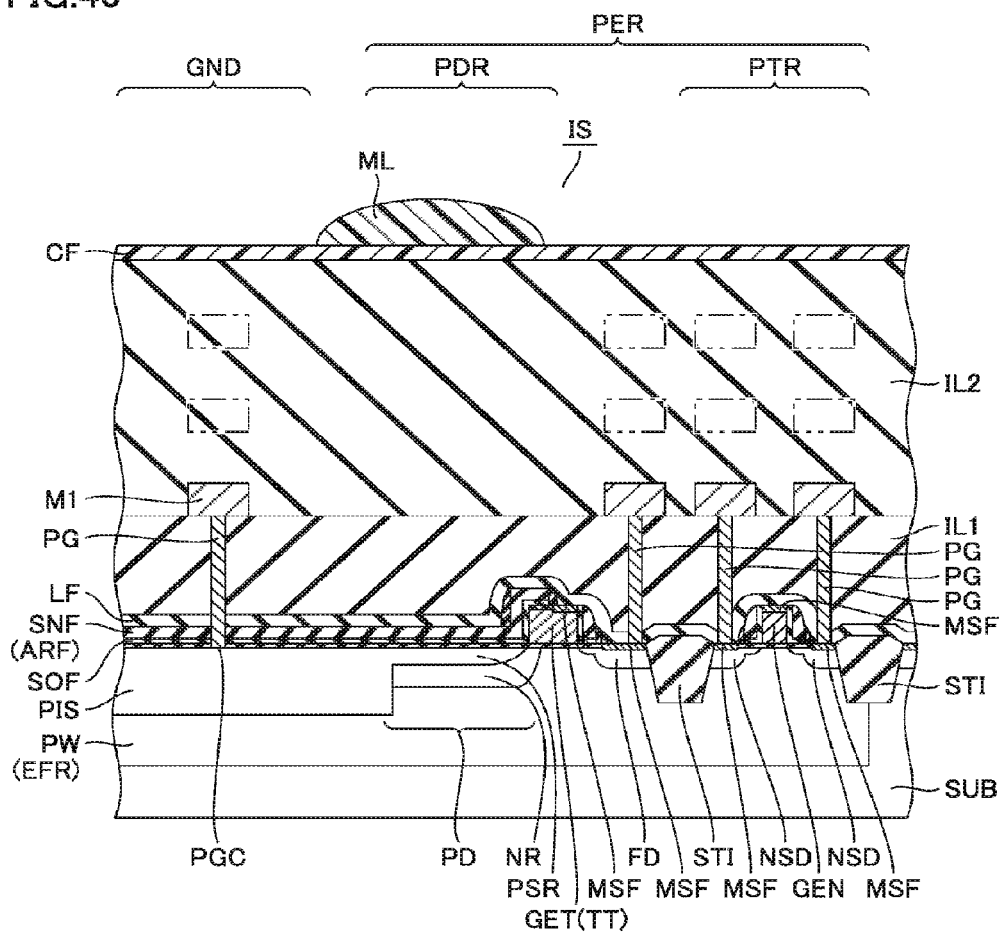
FIG. 40 is a cross-sectional view showing the step carried out after the step shown in FIG. 39 according to the first embodiment.

This etching process leads to formation of antireflection film ARF covering the entire photodiode region PDR and the entire ground region GND. Furthermore, sidewall insulating film SWF is formed on the side surface of each of gate electrode GET and gate electrode GEN. Then, photoresist pattern PR8 is removed, and the steps similar to those shown in FIGS. 17 to 21 are further performed, thereby completing a main part of image pickup device IS in which pn isolation is provided by a pn junction, as shown in FIG. 40.

In image pickup device IS in which pn isolation is provided by a pn junction described above, antireflection film ARF made of a silicon nitride film is formed so as to cover at least each of the entire photodiode region PDR and the entire ground region GND, so that a dark current can be suppressed. This will be described as compared with the image pickup device according to a comparative example.

Figure 41:
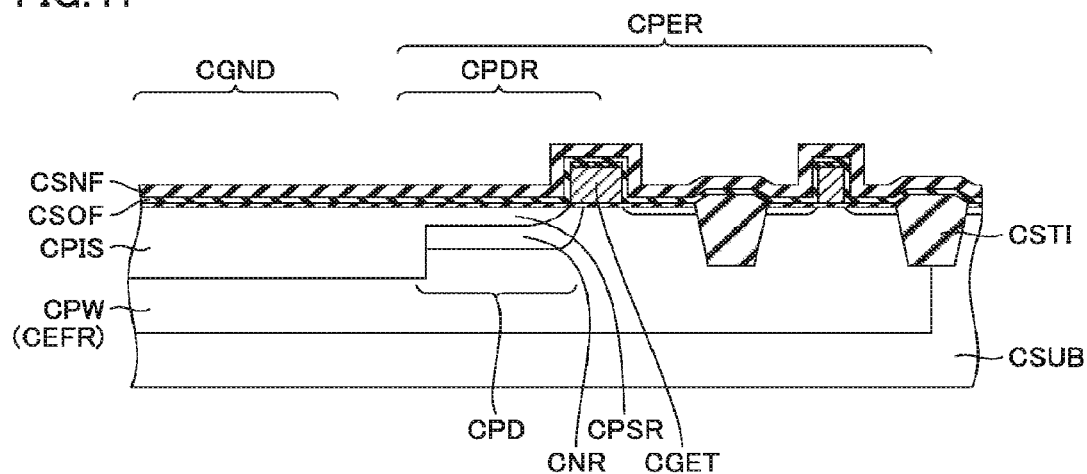
FIG. 41 is a cross-sectional view showing one step of a method of manufacturing an image pickup device according to a comparative example.

First, main steps of the method of manufacturing an image pickup device in which pn isolation is provided by a pn junction according to the comparative example will be hereinafter described. Through the steps similar to those shown in FIGS. 29 to 38 described above, isolation region CSTI, element formation region CEFR, P-type well CPW, photodiode CPD including N-type impurity region CNR, P-type impurity region CPSR, P-type guard ring CPGR, P-type impurity region CGPR, gate electrode CGET, and the like are formed in semiconductor substrate CSUB, as shown in FIG. 41. Then, a silicon oxide film CSOI is formed so as to cover gate electrode CGET and the like, and then, a silicon nitride film CSNF is formed so as to cover this silicon oxide film CSOI.

Figure 42:
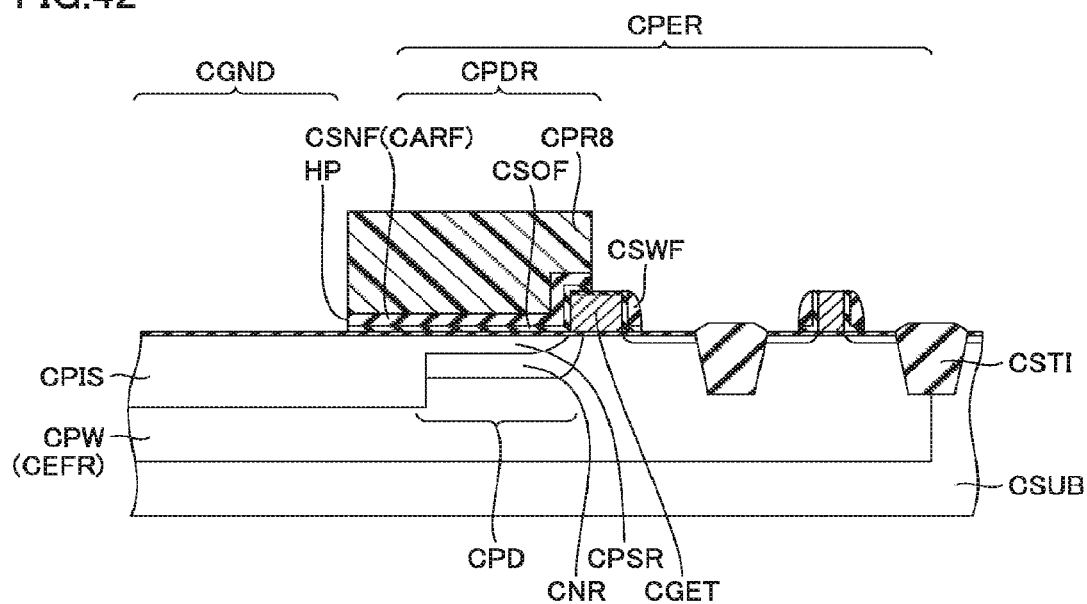
FIG. 42 is a cross-sectional view showing the step carried out after the step shown in FIG. 41.

Then, a prescribed photoengraving process is carried out to thereby form photoresist pattern CPR8 covering photodiode region CPDR as shown in FIG. 42. Then, silicon nitride film CSNF is subjected to an etching process using this photoresist pattern CPR8 as an etching mask, so that a portion of silicon nitride film CSNF that is located in photodiode region CPDR is patterned as antireflection film CARF. At this time, an opening HP is formed in ground region CGND, through which a portion having contact hole CCH formed therein and an area around this portion are exposed (see FIGS. 43 and 44).

Figure 43:
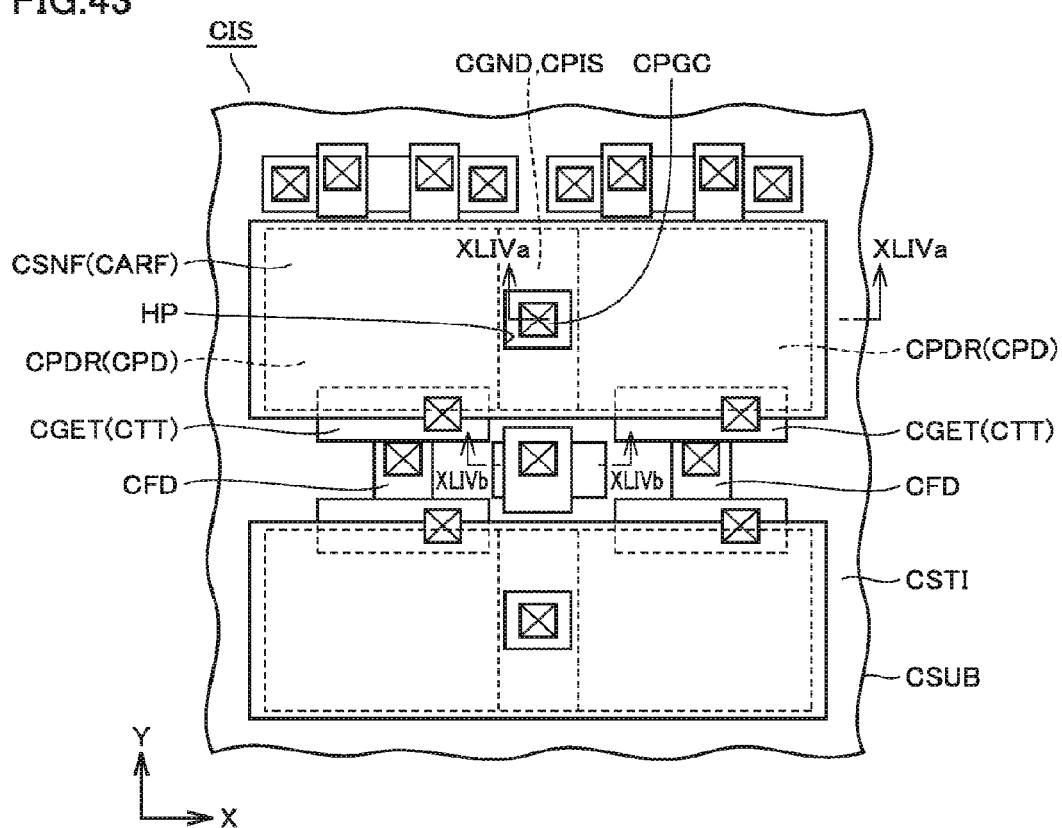
FIG. 43 is a plan view showing the step carried out after the step shown in FIG. 42, which illustrates an image pickup device in which a main part is completed.
Figure 44:
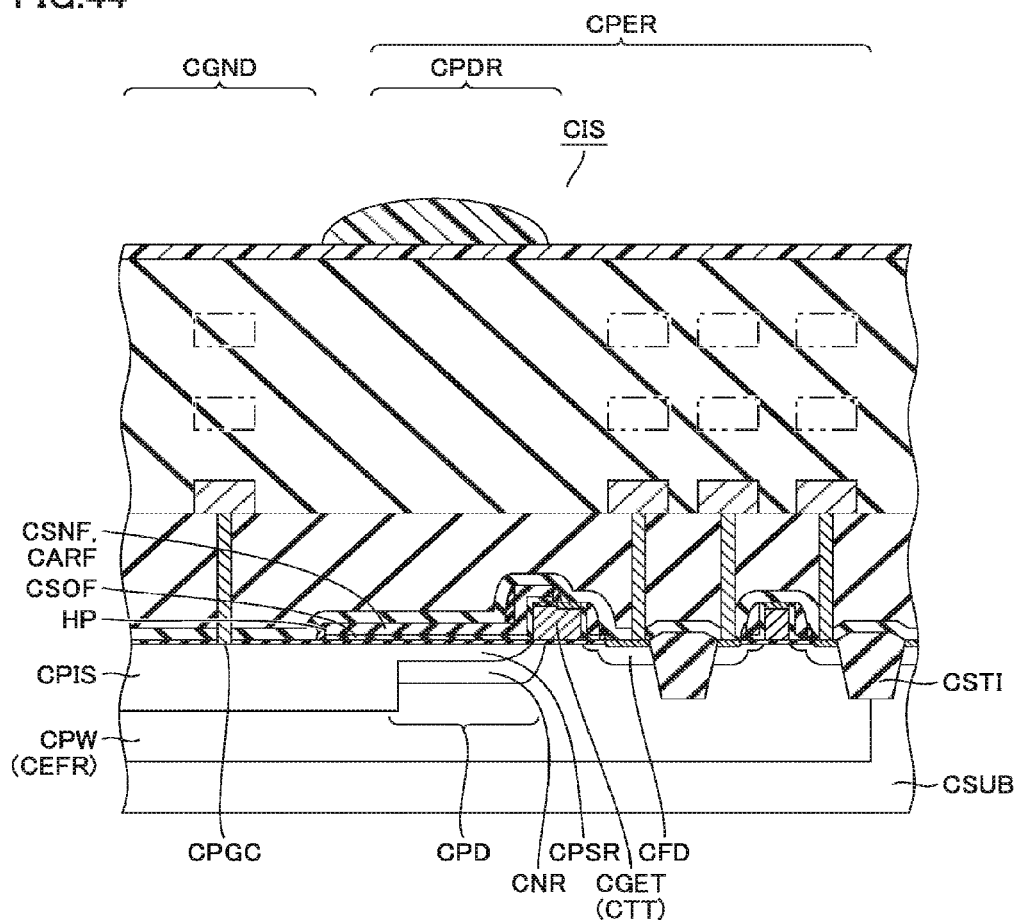
FIG. 44 is a cross-sectional view obtained by connecting cross-sectional views taken along cross-sectional lines XLIVa-XLIVa and XLIVb-XLIVb, respectively, shown in FIG. 43.

Then, photoresist pattern CPR8 is removed, and the steps similar to those shown in FIGS. 39 and 40 described above are carried out, thereby completing a main part of image pickup device CIS in which pn isolation is provided by a pn junction according to the comparative example, as shown in FIGS. 43 and 44.

In image pickup device CIS according to the comparative example, when antireflection film CARF is formed, opening HP is formed in a portion of silicon nitride film CSNF that is located in ground region CGND adjacent to photodiode region CPDR, as shown in FIG. 42. Accordingly, as in the case of the image pickup device in which isolation is provided by an insulating film according to the comparative example described above, plasma damage is more likely to occur in photodiode region CPDR due to the etching process. Consequently, a dark current may be generated in photodiode CPD.

In contrast to image pickup device CIS according to the comparative example, in image pickup device IS according to the present embodiment, photoresist pattern PR8 is formed so as to cover at least both of photodiode region PDR and ground region GND as shown in FIG. 39 when antireflection film ARF is formed.

Therefore, an etching process is not carried out on a portion of silicon nitride film SNF that is located in ground region GND adjacent to photodiode region PDR. As compared with image pickup device CIS according to the comparative example, plasma damage resulting from the etching process can be suppressed from occurring in photodiode region PDR.

Furthermore, in image pickup device IS in which pn isolation is provided by a pn junction according to the present embodiment, as in the case of image pickup device IS in which isolation is provided by an insulating film, silicon nitride film SNF is formed so as to cover at least photodiode region PDR and ground region GND while a portion of silicon nitride film SNF located in a region other than that is removed. Thereby, for example, the dangling bond of silicon is terminated by hydrogen sintering, so that a dark current in photodiode PD can be further reduced.

<Second Embodiment>

(Insulating Isolation)

The following is an explanation about the second example of an image pickup device in which a photodiode region and a ground region are isolated by an isolation insulating film.

Figure 45:
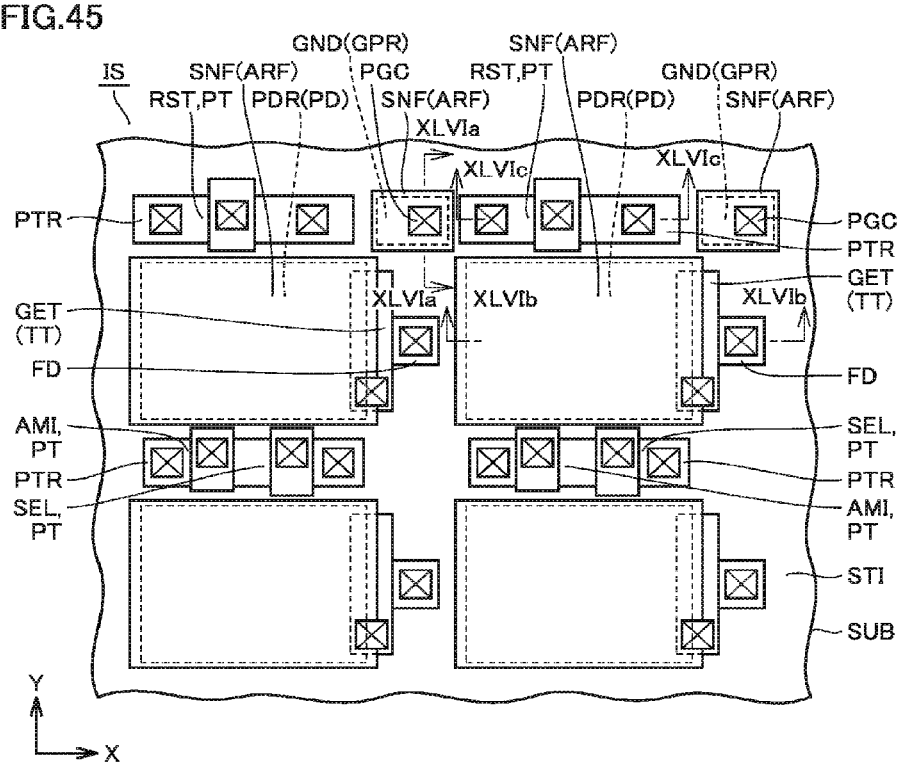
FIG. 45 is a plan view showing the second example of an image pickup device in which isolation is provided by an insulating film, according to the second embodiment.
Figure 46:
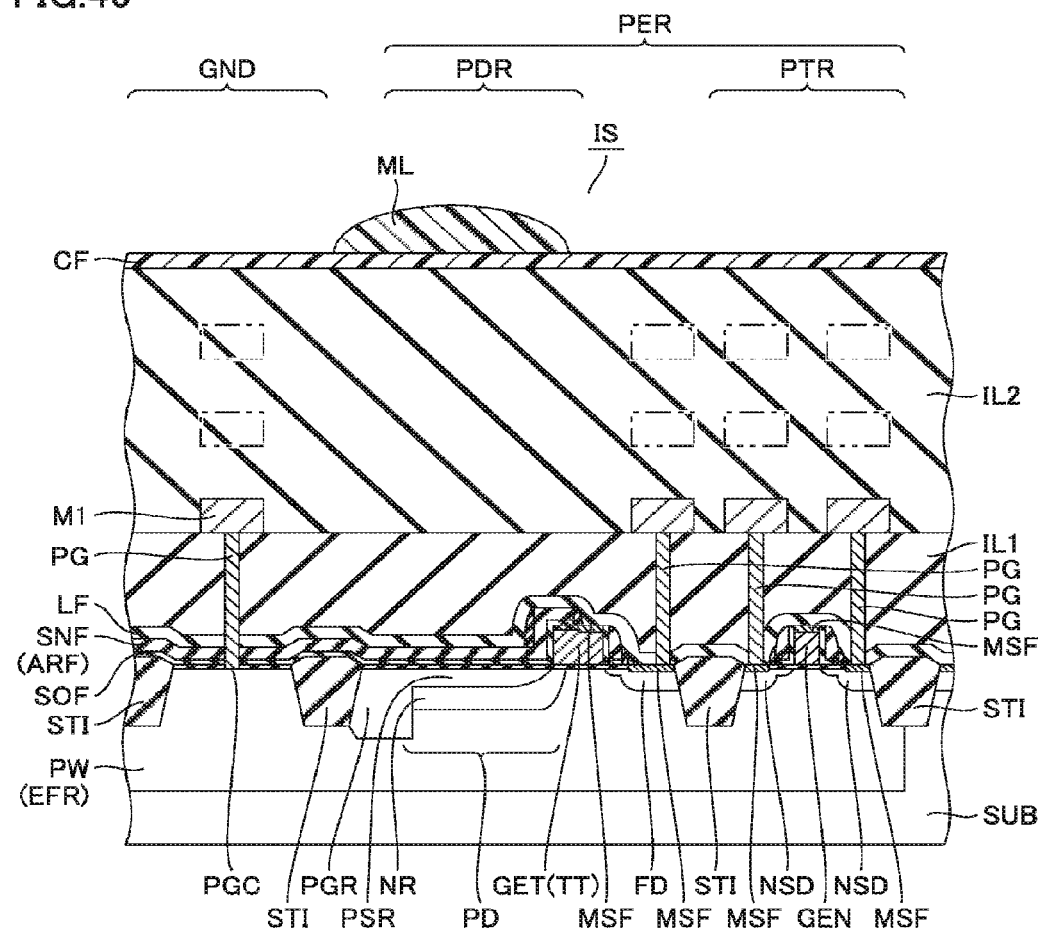
FIG. 46 is a cross-sectional view obtained by connecting cross-sectional views taken along cross-sectional lines XLVIa-XLVIa, XLVIb-XLVIb, and XLVIc-XLVIc, respectively, shown in FIG. 45 according to the second embodiment.

As shown in FIGS. 45 and 46, a portion of P-type well PW that has a relatively lower impurity concentration is located in ground region GND. Furthermore, in photodiode region PDR, P-type guard ring PGR (the third impurity region) that is higher in impurity concentration than P-type well PW is formed along isolation region STI between isolation region STI and photodiode PD.

Thus, in image pickup device IS, the impurity concentration of the p-type impurities exhibits a concentration gradient between ground region GND and photodiode PD, and P-type guard ring PGR serves as a potential barrier. Since the configuration other than the above is similar to that of image pickup device IS shown in each of FIGS. 2 and 3, the same components are designated by the same reference characters, and description thereof will not be repeated unless otherwise required.

Then, an example of the method of manufacturing image pickup device IS in which isolation is provided by an insulating film described above will be hereinafter described. This method is substantially the same as the above-described method of manufacturing an image pickup device in which isolation is provided by an insulating film except that P-type impurity region GPR is not formed in ground region GND. Accordingly, the same components are designated by the same reference characters, and briefly described.

Figure 47:
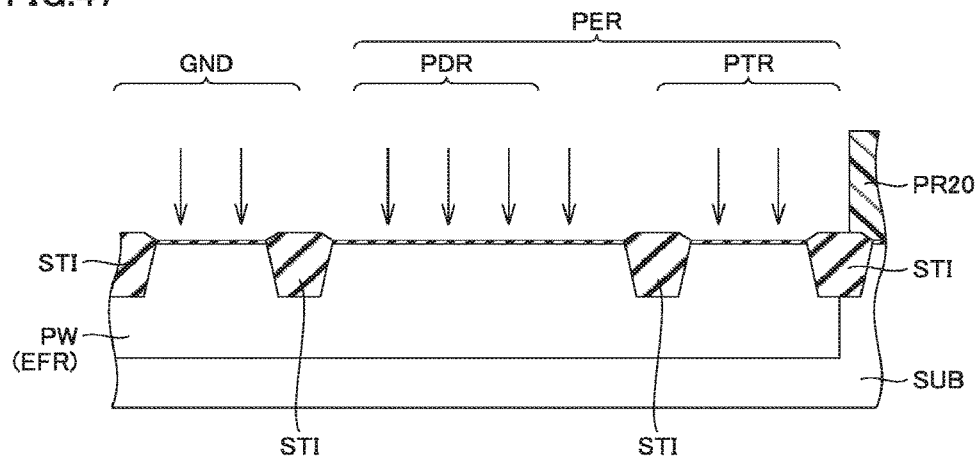
FIG. 47 is a cross-sectional view showing one step of a method of manufacturing the second example of an image pickup device in which isolation is provided by an insulating film, according to the second embodiment.

First, after the steps similar to those shown in FIGS. 4 to 6 described above are performed, p-type impurities are implanted using a photoresist pattern 20 as an implantation mask, thereby forming a part of P-type well PW, as shown in FIG. 47. Then, photoresist pattern 20 is removed.

Figure 48:
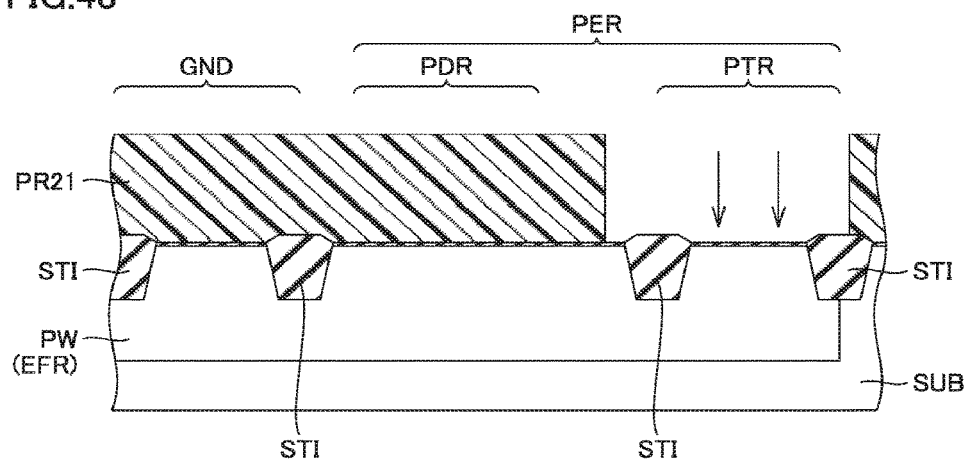
FIG. 48 is a cross-sectional view showing the step carried out after the step shown in FIG. 47 according to the second embodiment.

Then, a prescribed photoengraving process is carried out to thereby expose pixel transistor region PTR, so that a photoresist pattern PR21 covering other regions including ground region GND is formed, as shown in FIG. 48. Then, p-type impurities for preventing crosstalk are implanted using this photoresist pattern PR21 as an implantation mask. Then, photoresist pattern PR21 is removed.

Figure 49:
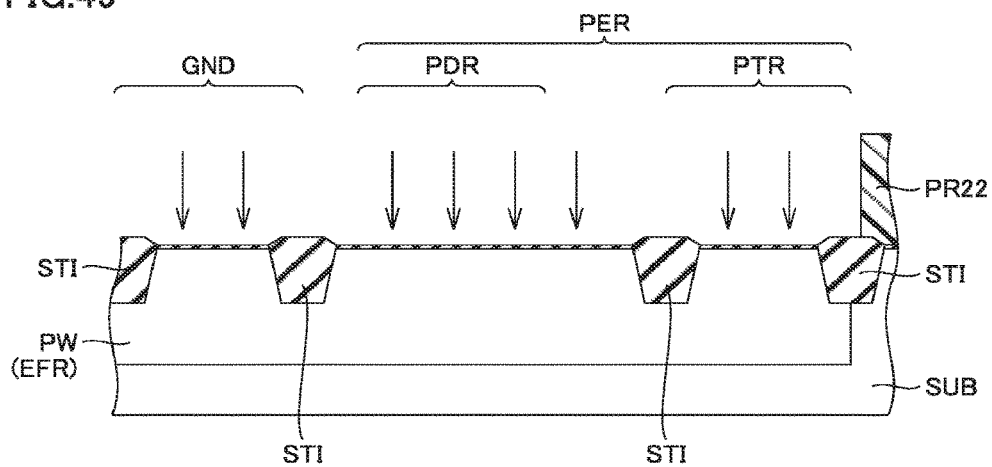
FIG. 49 is a cross-sectional view showing the step carried out after the step shown in FIG. 48 according to the second embodiment.

Then, a prescribed photoengraving process is carried out to thereby expose pixel region PER and ground region GND, so that photoresist pattern PR22 covering other regions is formed as shown in FIG. 49. Then, p-type impurities are implanted using photoresist pattern PR22 as an implantation mask, thereby forming the remaining portion of P-type well PW. Then, photoresist pattern PR22 is removed.

Figure 50:
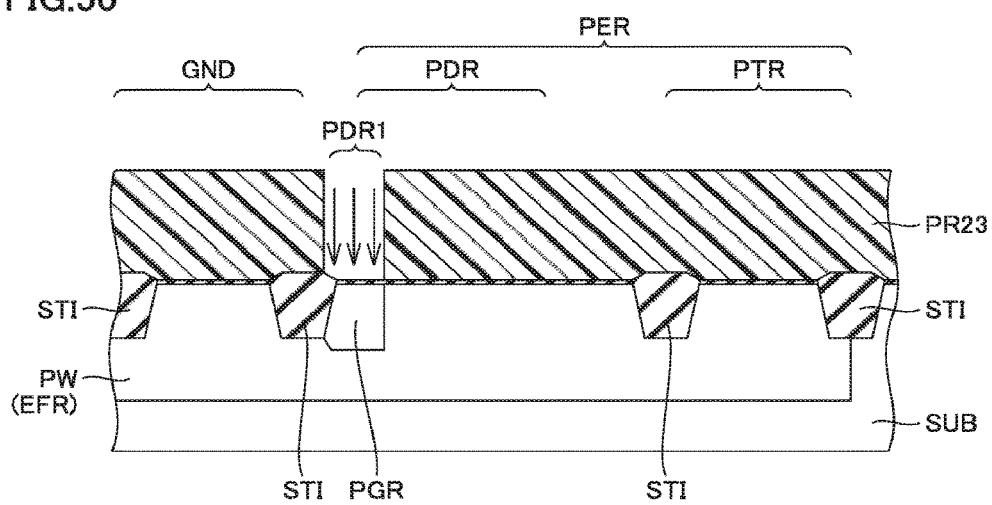
FIG. 50 is a cross-sectional view showing the step carried out after the step shown in FIG. 49 according to the second embodiment.

Then, a prescribed photoengraving process is carried out to thereby expose region PDR1 corresponding to a part of photodiode region PDR, so that a photoresist pattern PR23 covering other regions is formed, as shown in FIG. 50. Then, p-type impurities are implanted using photoresist pattern PR23 as an implantation mask, so that P-type guard ring PGR having a relatively higher impurity concentration is formed along isolation region STI in region PDR1 corresponding to a part of photodiode region PDR.

This P-type guard ring PGR is formed as a barrier for preventing photodiode PD from being influenced by electric charge generated on the boundary with isolation region STI. Furthermore, as described below, P-type guard ring PGR serves as a potential barrier for preventing the photodiode from being influenced by electric charge from ground region GND. Then, photoresist pattern PR23 is removed.

Figure 51:
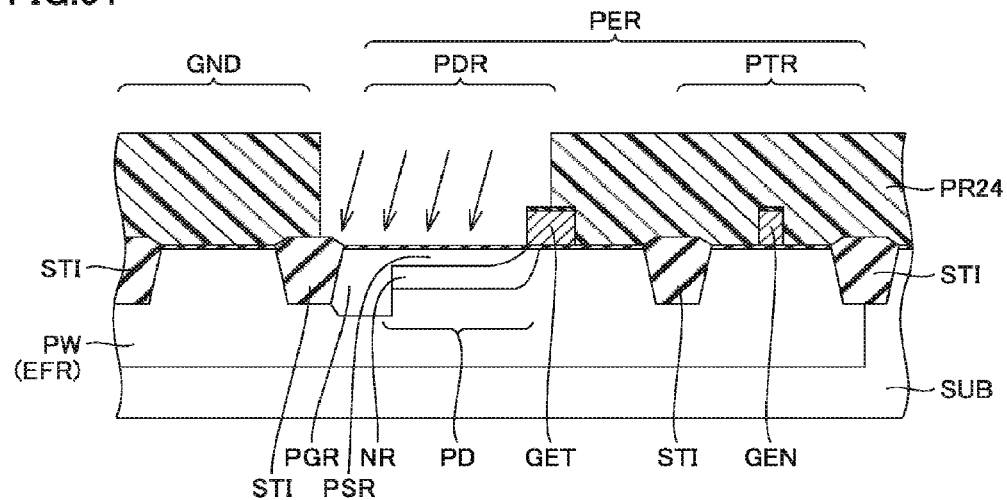
FIG. 51 is a cross-sectional view showing the step carried out after the step shown in FIG. 50 according to the second embodiment.

Then, after the step similar to that shown in FIG. 10 is performed, a prescribed photoengraving process is carried out to thereby expose photodiode region PDR, so that a photoresist pattern PR24 covering other regions is formed, as shown in FIG. 51. Then, n-type impurities are implanted using this photoresist pattern PR24 as an implantation mask, thereby forming N-type impurity region NR in the photodiode. Then, photoresist pattern PR24 is removed.

Figure 52:
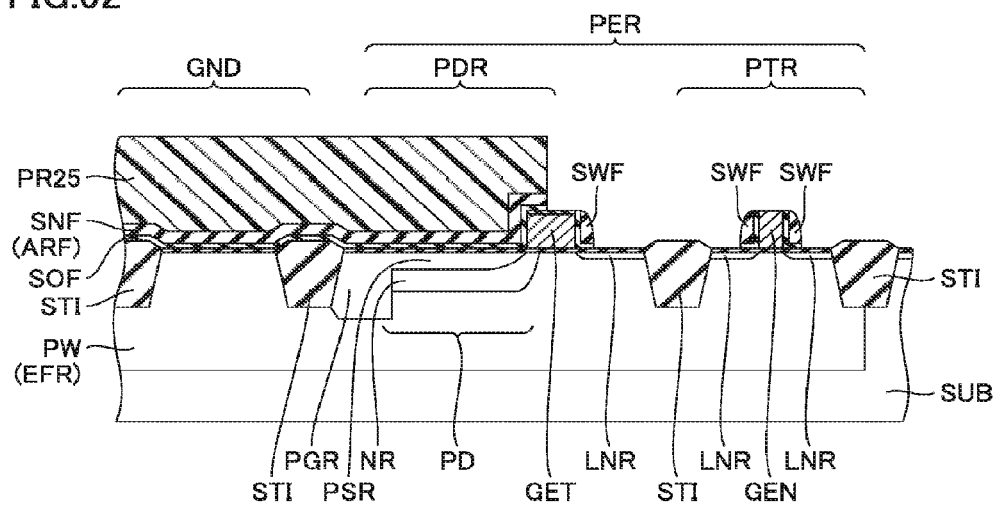
FIG. 52 is a cross-sectional view showing the step carried out after the step shown in FIG. 51 according to the second embodiment.

Then, after the steps similar to those shown in FIGS. 12 to 15 are performed, a prescribed photoengraving process is carried out to thereby cover photodiode region PDR and ground region GND, so that a photoresist pattern PR25 is formed, through which pixel transistor region PTR and the like are exposed, as shown in FIG. 52. Then, silicon nitride film SNF and the like are subjected to an etching process using this photoresist pattern PR25 as an etching mask.

Figure 53:
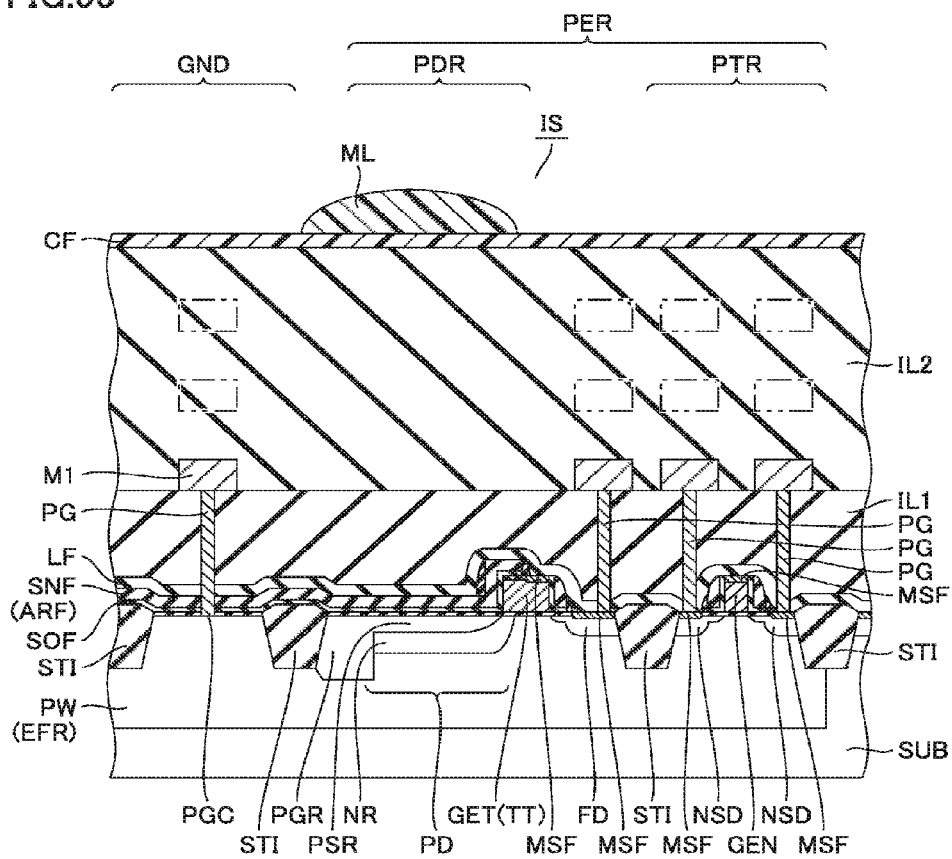
FIG. 53 is a cross-sectional view showing the step carried out after the step shown in FIG. 52 according to the second embodiment.

This etching process leads to formation of antireflection film ARF covering the entire photodiode region PDR and the entire ground region GND. Furthermore, sidewall insulating film SWF is formed on the side surface of each of gate electrode GET and gate electrode GEN. Then, photoresist pattern PR25 is removed, and the steps similar to those shown FIGS. 16 to 22 are performed, so that a main part of image pickup device IS is completed as shown in FIG. 53.

In image pickup device IS described above, similarly to the description given in the first embodiment, when antireflection film ARF is formed, an etching process is not carried out on a portion of silicon nitride film SNF that is located in ground region GND arranged in the vicinity of photodiode region PDR. Thus, plasma damage resulting from the etching process can be suppressed from occurring in photodiode region CPDR. Consequently, a dark current in photodiode PD can be suppressed.

Furthermore, silicon nitride film SNF is formed so as to cover at least photodiode region PDR and ground region GND while a portion of silicon nitride film SNF located in a region other than that is removed. Thereby, for example, the dangling bond of silicon can be terminated by hydrogen sintering, so that a dark current in photodiode PD can be further reduced.

Furthermore, in image pickup device IS described above, P-type guard ring PGR having an impurity concentration higher than that of P-type well PW is formed between photodiode PD and a portion of P-type well PW that is located in ground region GND. This P-type guard ring PGR is to be located, as a potential barrier having a relatively higher p-type impurity concentration, between ground region GND (a portion of P-type well PW) and photodiode PD. Thereby, for example, even if excessive electrons may be generated in ground region GND due to the p-type impurities implanted into ground region GND, such excessive electrons can be suppressed from flowing into photodiode PD and turning into a dark current.

(Pn Isolation)

The following is an explanation of the second example of an image pickup device in which a photodiode region and a ground region are pn-isolated by a pn junction.

Figure 54:
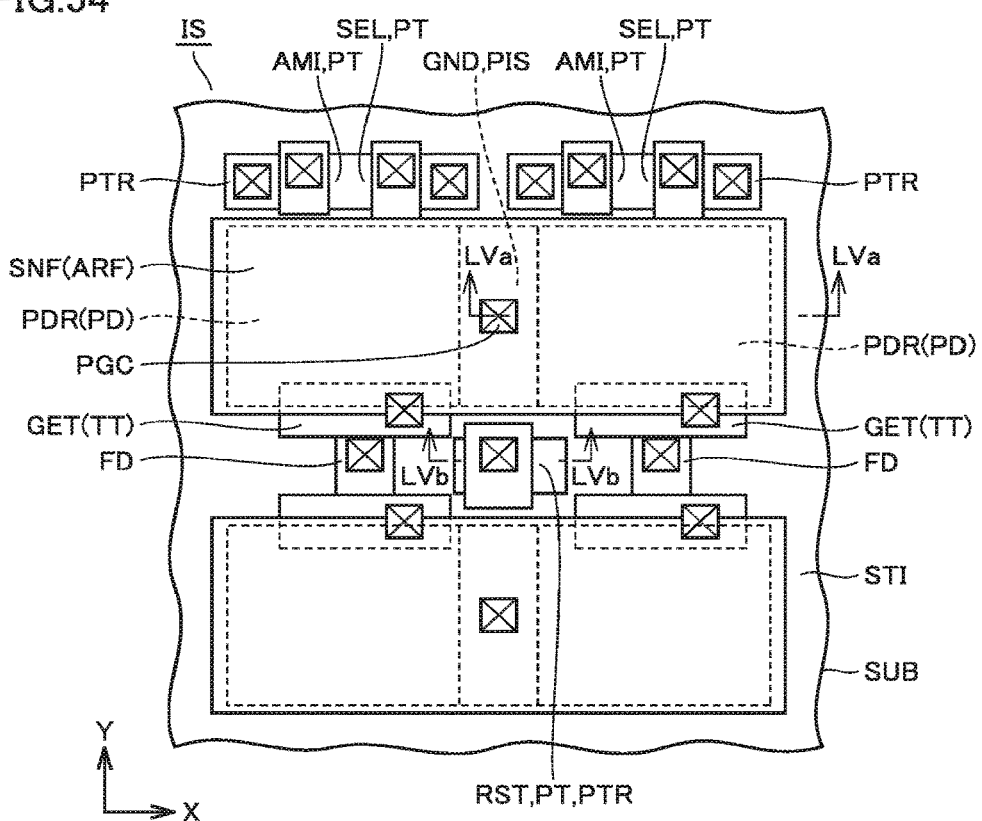
FIG. 54 is a plan view showing the second example of an image pickup device in which pn isolation is provided by a pn junction, according to the second embodiment.
Figure 55:
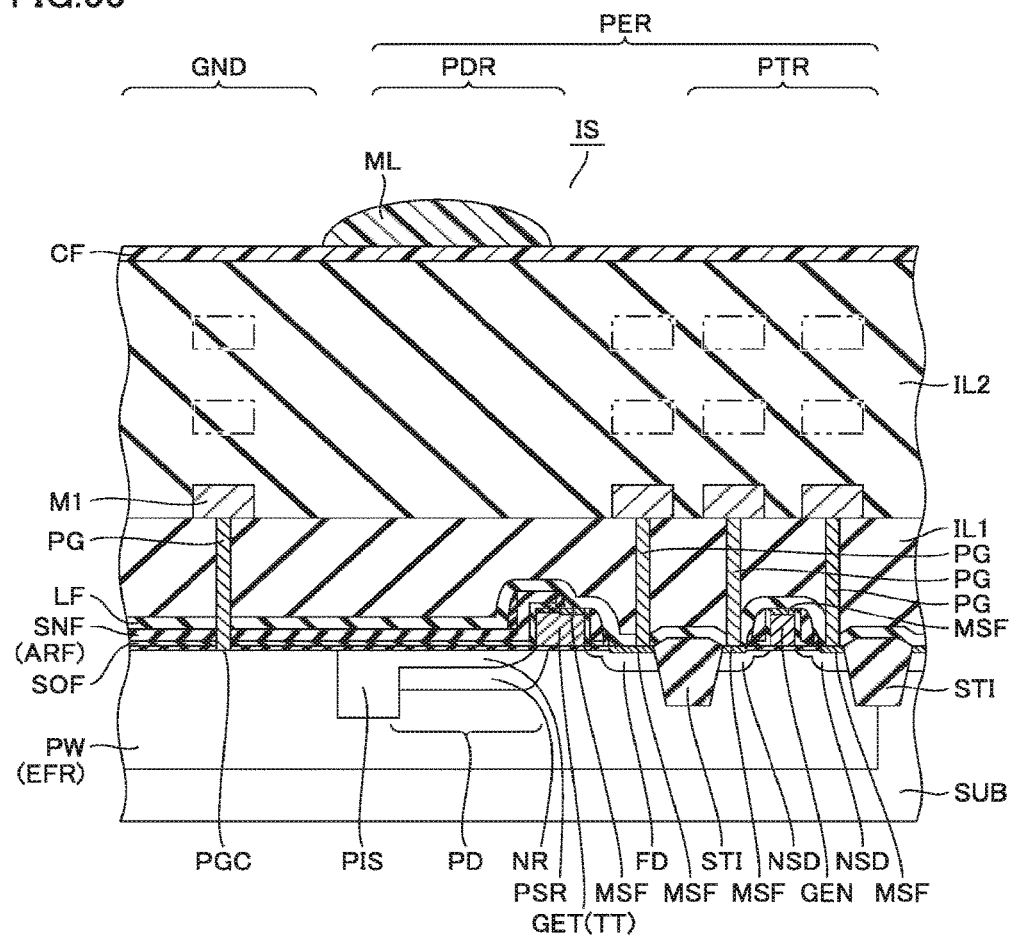
FIG. 55 is a cross-sectional view obtained by connecting cross-sectional views taken along cross-sectional lines LVa-LVa and LVb-LVb, respectively, shown in FIG. 54 according to the second embodiment.

As shown in FIGS. 54 and 55, photodiode region PDR and ground region GND are arranged adjacent to each other. A portion of P-type well PW that has a relatively lower impurity concentration is located in ground region GND. A P-type impurity region PIS having an impurity concentration higher than that of P-type well PW (the sixth impurity concentration) is formed between this portion of P-type well PW and photodiode PD.

Photodiode region PDR and ground region GND are pn-isolated by a junction between P-type impurity region PIS and N-type impurity region NR of photodiode PD. Thus, in image pickup device IS, the impurity concentration of the p-type impurities exhibits a concentration gradient between ground region GND and photodiode PD, and P-type impurity region PIS serves as a potential barrier.

Silicon nitride film SNF serving as antireflection film ARF is formed so as to cover at least photodiode region PDR and ground region GND. Since the configuration other than the above is similar to that of image pickup device IS shown in each of FIGS. 45 and 46, the same components are designated by the same reference characters, and description thereof will not be repeated unless otherwise required.

Then, an example of the method of manufacturing an image pickup device IS in which pn isolation is provided by a pn junction will be hereinafter described. This method is substantially the same as the method of manufacturing an image pickup device in which isolation is provided by an insulating film according to the second example, except that an isolation region is not formed between photodiode region PDR and ground region GND. Accordingly, the same components are designated by the same reference characters, and briefly described.

Figure 56:
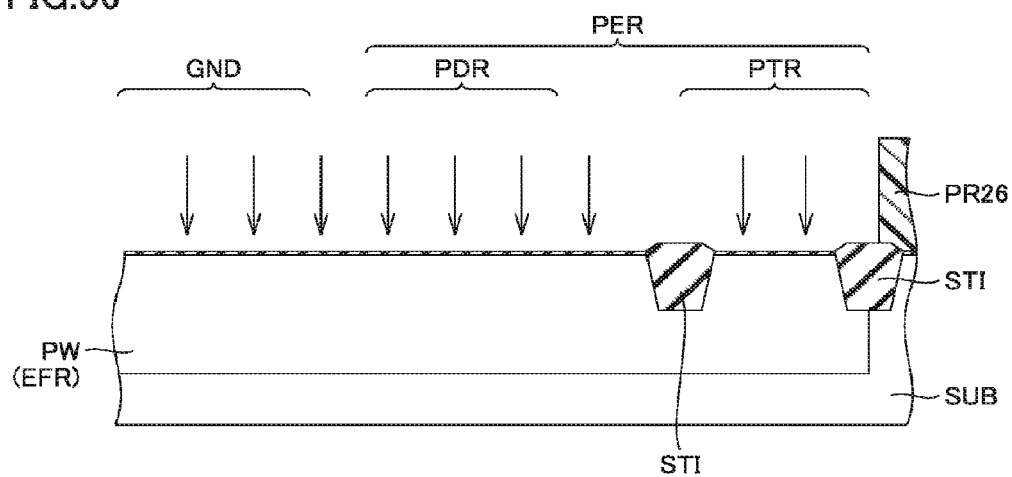
FIG. 56 is a cross-sectional view showing one step of a method of manufacturing the second example of an image pickup device in which pn isolation is provided by a pn junction, according to the second embodiment.

First, after the steps similar to those shown in FIGS. 4 to 6 described above are performed, p-type impurities are implanted using a photoresist pattern 26 as an implantation mask, thereby forming a part of P-type well PW, as shown in FIG. 56. Then, photoresist pattern 26 is removed.

Figure 57:
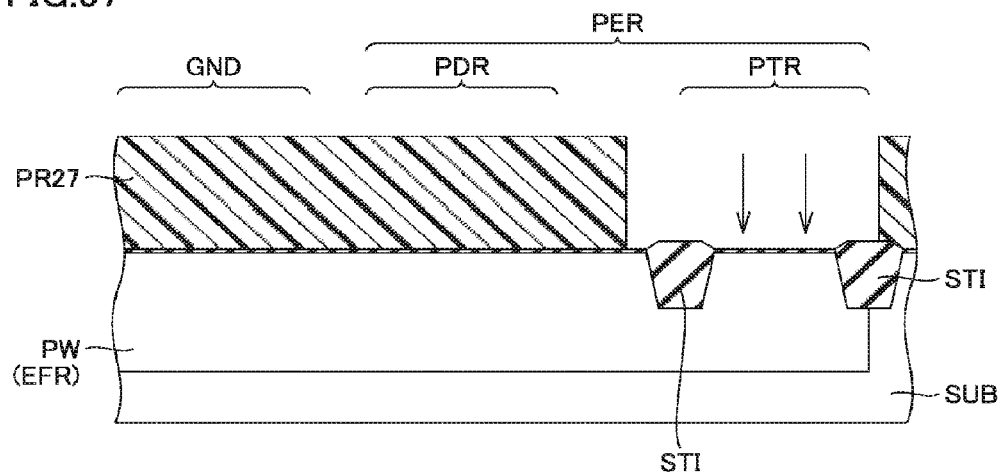
FIG. 57 is a cross-sectional view showing the step carried out after the step shown in FIG. 56 according to the second embodiment.
Figure 58:
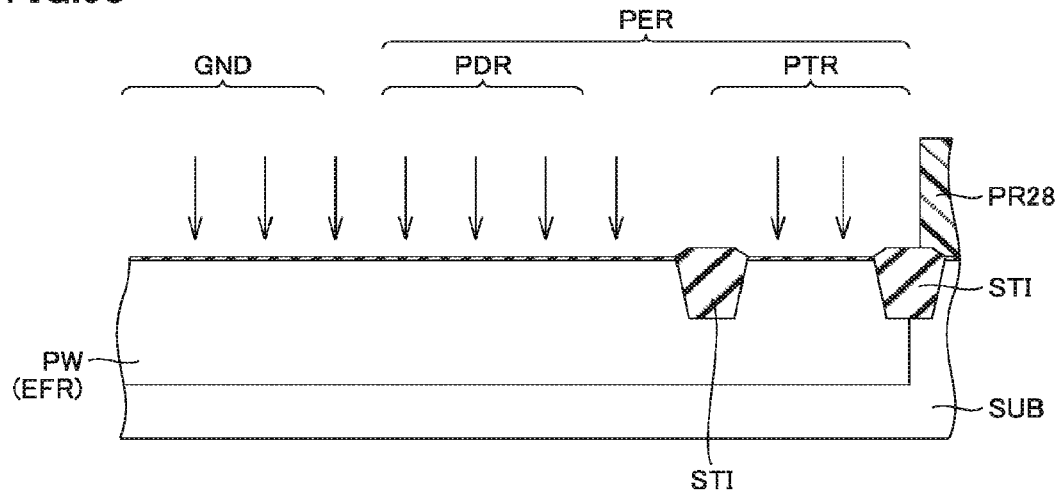
FIG. 58 is a cross-sectional view showing the step carried out after the step shown in FIG. 57 according to the second embodiment.

Then, p-type impurities for preventing crosstalk are implanted using photoresist pattern PR27 as an implantation mask, as shown in FIG. 57. Then, p-type impurities are further implanted using photoresist pattern PR28 as an implantation mask, thereby forming a remaining portion of P-type well PW, as shown in FIG. 58.

Figure 59:
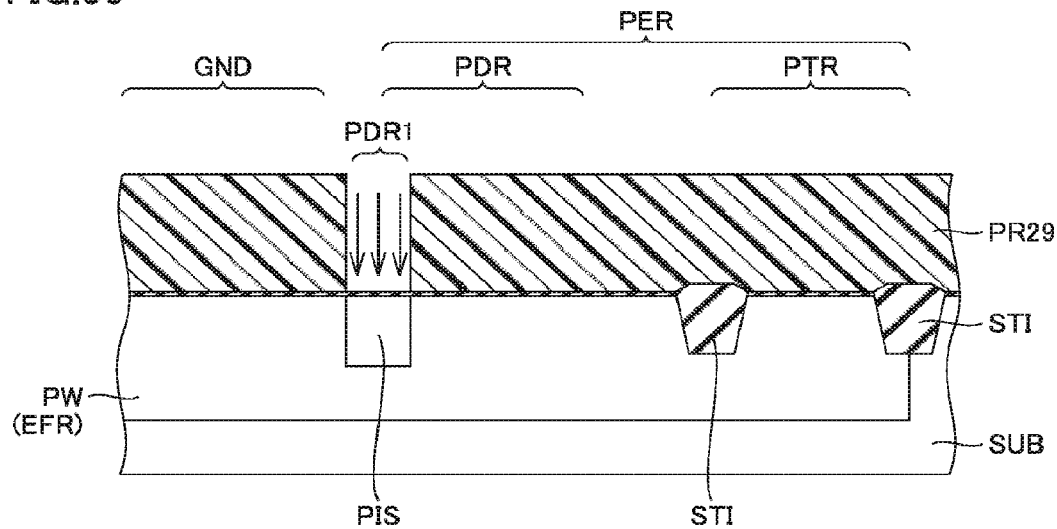
FIG. 59 is a cross-sectional view showing the step carried out after the step shown in FIG. 58 according to the second embodiment.

Then, a prescribed photoengraving process is carried out to thereby expose a region PDR1 corresponding to a part of photodiode region PDR, so that a photoresist pattern PR29 covering other regions is formed, as shown in FIG. 59. Then, p-type impurities are implanted using photoresist pattern PR29 as an implantation mask, so that P-type impurity region PIS is formed in region PDR1 corresponding to a part of photodiode region PDR. This P-type impurity region PIS serves as a potential barrier for preventing photodiode PD from being influenced by electric charge from ground region GND. Then, photoresist pattern PR29 is removed.

Figure 60:
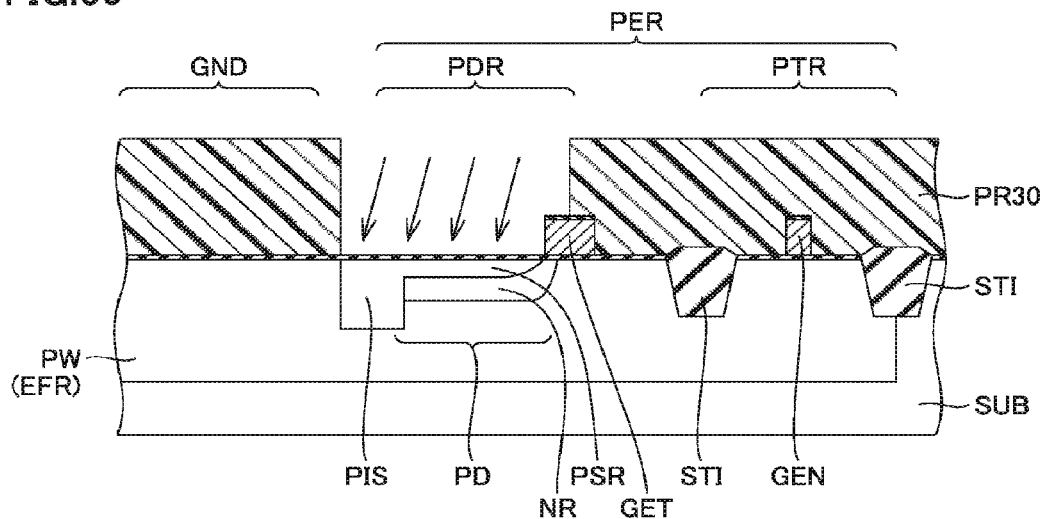
FIG. 60 is a cross-sectional view showing the step carried out after the step shown in FIG. 59 according to the second embodiment.

Then, after the step similar to that shown in FIG. 10 is performed, a prescribed photoengraving process is carried out to thereby expose photodiode region PDR, so that a photoresist pattern PR30 covering other regions is formed, as shown in FIG. 60. Then, n-type impurities are implanted using this photoresist pattern PR30 as an implantation mask, thereby forming N-type impurity region NR in the photodiode. Then, photoresist pattern PR30 is removed.

Figure 61:
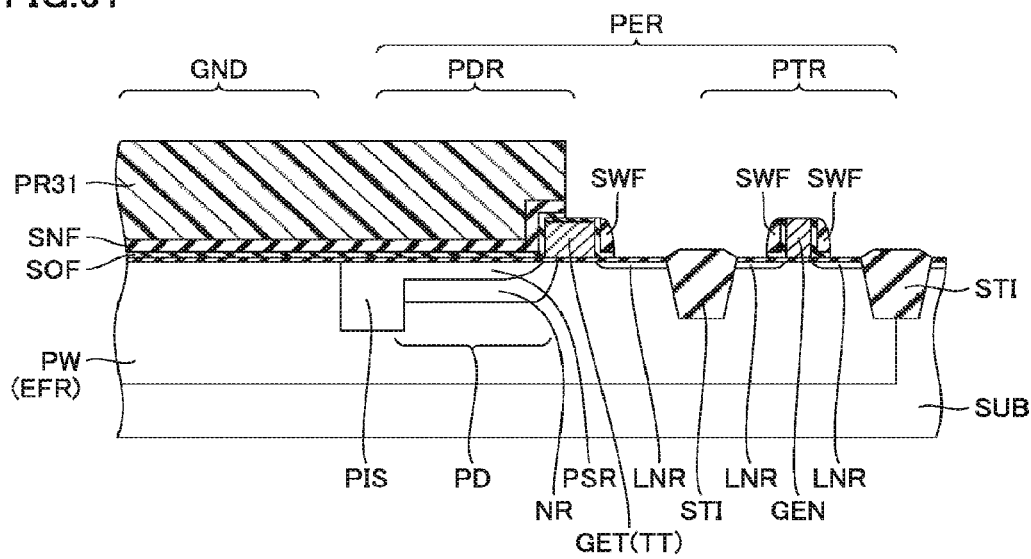
FIG. 61 is a cross-sectional view showing the step carried out after the step shown in FIG. 60 according to the second embodiment.

Then, after the steps similar to those shown in FIGS. 12 to 15 are performed, a prescribed photoengraving process is carried out to cover photodiode region PDR and ground region GND, thereby forming photoresist pattern PR31 through which pixel transistor region PTR and the like are exposed, as shown in FIG. 61. Then, silicon nitride film SNF and the like are subjected to an etching process using this photoresist pattern PR31 as an etching mask.

Figure 62:
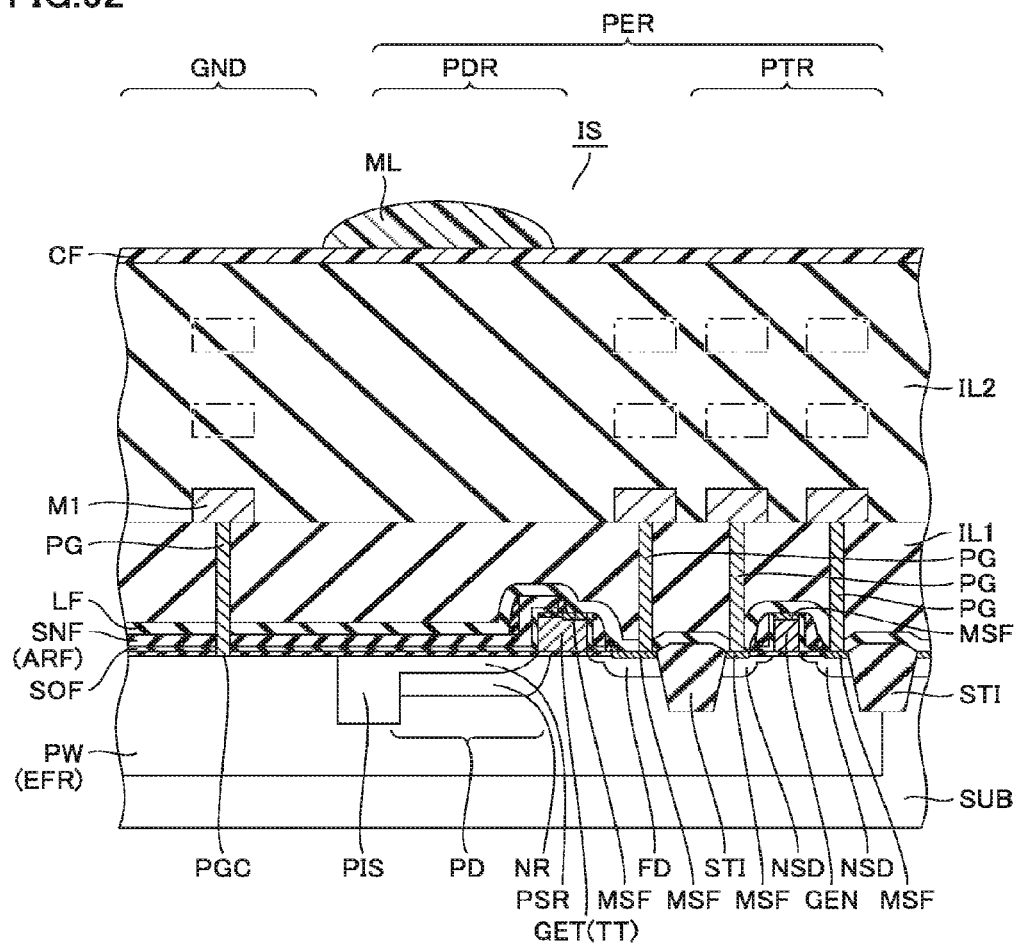
FIG. 62 is a cross-sectional view showing the step carried out after the step shown in FIG. 61 according to the second embodiment.

This etching process leads to formation of antireflection film ARF covering the entire photodiode region PDR and the entire ground region GND. Furthermore, sidewall insulating film SWF is formed on the side surface of each of gate electrode GET and gate electrode GEN. Then, photoresist pattern PR31 is removed and the steps similar to those shown in FIGS. 16 to 22 are performed, so that a main part of image pickup device IS is completed as shown in FIG. 62.

In image pickup device IS according to the present embodiment, when antireflection film ARF is formed, an etching process is not carried out on a portion of silicon nitride film SNF that is located in ground region GND adjacent to photodiode region PDR. Thus, plasma damage resulting from the etching process can be suppressed from occurring in photodiode region PDR.

Furthermore, silicon nitride film SNF is formed so as to cover at least photodiode region PDR and ground region GND while a portion of silicon nitride film SNF that is located in a region other than that is removed. Accordingly, for example, the dangling bond of silicon can be terminated by hydrogen sintering, so that a dark current in photodiode PD can be further reduced.

Furthermore, in image pickup device IS as described above, P-type impurity region PIS formed between photodiode PD and a portion of P-type well PW that is located in ground region GND serves as a potential barrier having a relatively higher P-type impurity concentration. Thereby, for example, even if excessive electrons may be generated in ground region GND due to the p-type impurities implanted into ground region GND, such excessive electrons can be suppressed from flowing into photodiode PD and turning into a dark current.

Third Embodiment
(Insulating Isolation)

The following is an explanation about the third example of an image pickup device in which a photodiode region and a ground region are isolated by an isolation insulating film.

Figure 63:
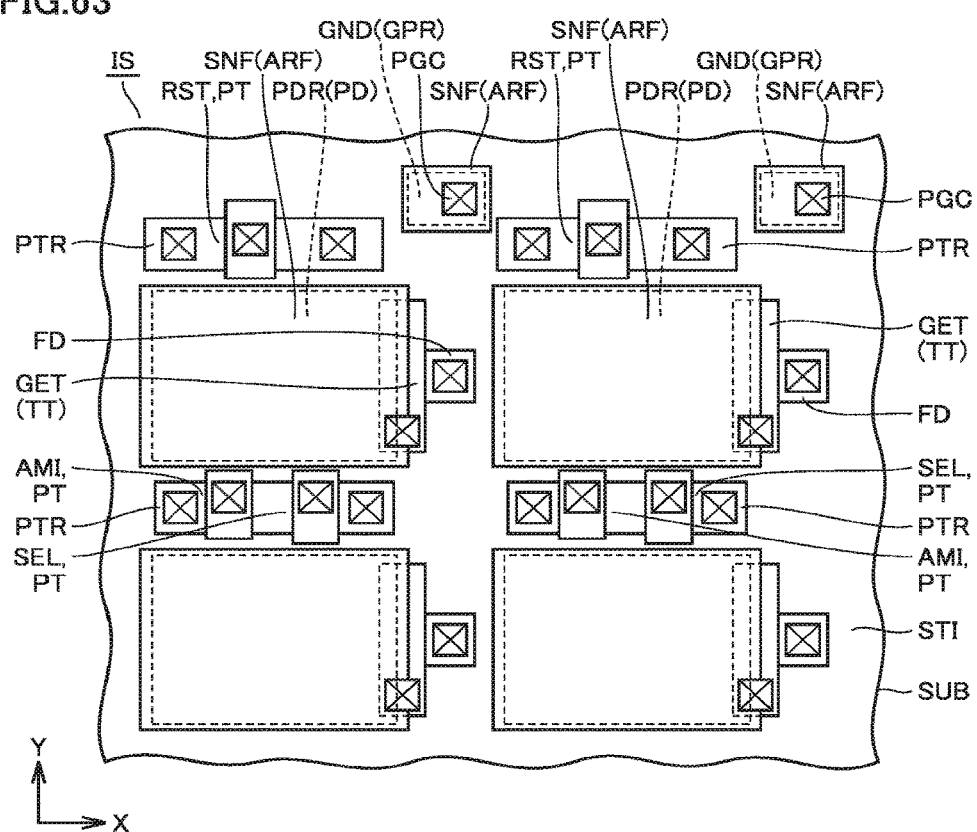
FIG. 63 is a plan view showing the third example of an image pickup device in which isolation is provided by an insulating film, according to the third embodiment.

As shown in FIG. 63, photodiode region PDR, floating diffusion region FD, pixel transistor region PTR having pixel transistor PT formed therein, ground region GND, and the like are defined by isolation region STI on the surface of semiconductor substrate SUB. Silicon nitride film SNF as antireflection film ARF is formed so as to cover at least photodiode region PDR and ground region GND.

Pixel transistor region PTR is arranged adjacent to photodiode region PDR. Ground region GND is arranged in a direction away from photodiode region PDR (for example, in the Y direction) with respect to this pixel transistor region PTR. In other words, ground region GND is arranged so as to be further distanced from photodiode region PDR. Since the configuration other than the above is similar to that of image pickup device IS shown in each of FIGS. 2 and 3, the same components are designated by the same reference characters, and description thereof will not be repeated unless otherwise required.

In image pickup device IS as described above, ground region GND and photodiode region PDR are arranged so as to be further distanced from each other, so that a dark current in photodiode PD can be suppressed. This will be hereinafter described as compared with the image pickup device according to a comparative example.

Figure 64:
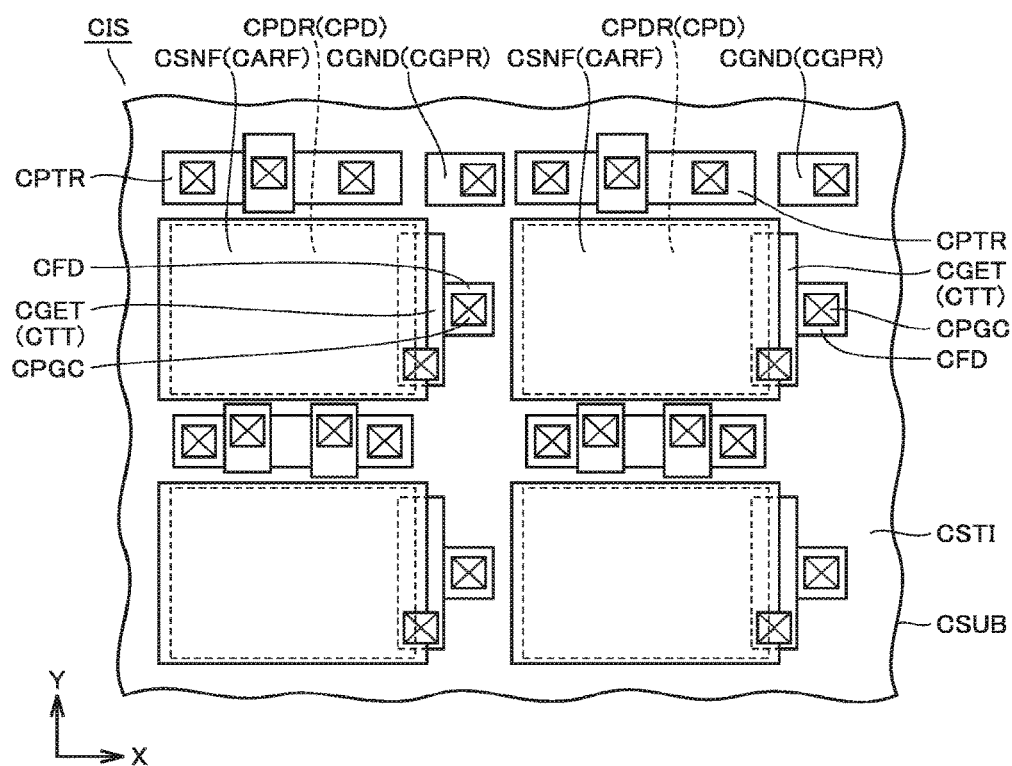
FIG. 64 is a plan view showing an image pickup device according to a comparative example.

As shown in FIG. 64, in image pickup device CIS according to the comparative example, photodiode region CPDR, floating diffusion region CFD, pixel transistor region CPTR, ground region CGND, and the like are defined by isolation region CSTI on the surface of semiconductor substrate CSUB. Silicon nitride film CSNF as antireflection film CARF is formed so as to cover photodiode region CPDR.

Pixel transistor region CPTR is arranged adjacent to photodiode region CPDR. Ground region CGND is arranged in the same Y direction as that of its pixel transistor region CPTR. Since the configuration other than the above is similar to that of image pickup device CIS shown in FIG. 25, the same components are designated by the same reference characters, and description thereof will not be repeated unless otherwise required.

In image pickup device CIS according to the comparative example, plasma damage is more likely to occur in a photodiode region CPDR when an etching process is carried out on a portion of silicon nitride film CSNF serving as antireflection film CARF that is located in ground region CGND. Also, ground region CGND is arranged so as to be located in the same Y direction as that of pixel transistor region CPTR, and located relatively close to photodiode region CPDR. Accordingly, plasma damage is more likely to occur.

In contrast to image pickup device IS according to the comparative example, in image pickup device IS according to the present embodiment, antireflection film ARF is formed so as to cover at least photodiode region PDR and ground region GND. Thereby, an etching process is not carried out on a portion of silicon nitride film SNF that is located in ground region GND, so that plasma damage resulting from the etching process can be suppressed from occurring in photodiode region CPDR. Also, the dangling bond of silicon can be terminated.

Furthermore, ground region GND is arranged in a direction away from photodiode region PDR (for example, in the Y direction) from pixel transistor region PTR. Also, ground region GND and photodiode region PDR are arranged so as to be further distanced away from each other. Thereby, plasma damage resulting from the etching process is reduced. Consequently, a dark current resulting from plasma damage can be reliably suppressed.

(Insulating Isolation)

The following is an explanation about the fourth example of an image pickup device in which a photodiode region and a ground region are isolated by an isolation insulating film.

Figure 65:
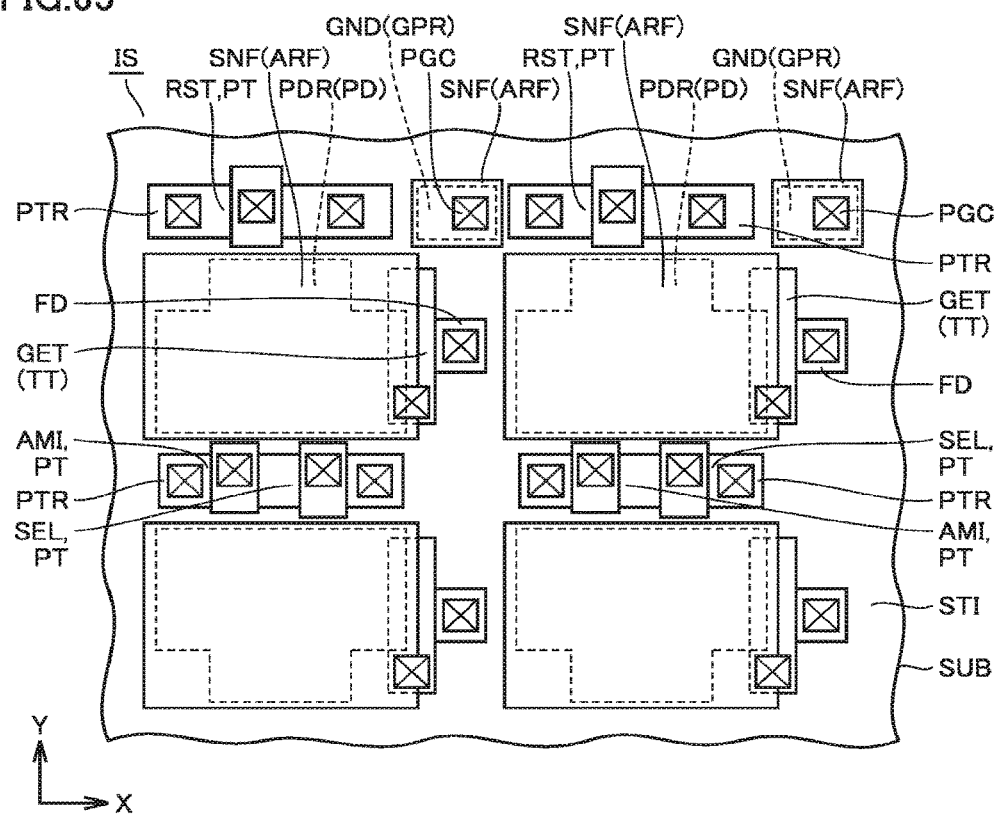
FIG. 65 is a plan view showing the fourth example of an image pickup device in which isolation is provided by an insulating film, according the third embodiment.

As shown in FIG. 65, photodiode region PDR, floating diffusion region FD, pixel transistor region PTR, ground region GND, and the like are defined by isolation region STI on the surface of semiconductor substrate SUB. Silicon nitride film SNF as antireflection film ARF is formed so as to cover at least photodiode region PDR and ground region GND.

Pixel transistor region PTR is arranged adjacent to photodiode region PDR. Ground region GND is arranged in the same Y direction as that of its pixel transistor region PTR. Photodiode region PDR has a corner portion that recedes so as to be distanced from ground region GND or contact portion PGC.

In other words, photodiode region PDR is arranged so as to be further distanced from ground region GND or contact portion PGC. Since the configuration other than the above is similar to that of image pickup device IS shown in each of FIGS. 2 and 3, the same components are designated by the same reference characters, and description thereof will not be repeated unless otherwise required.

In image pickup device IS as described above, antireflection film ARF is formed so as to cover at least photodiode region PDR and ground region GND. Thus, an etching process is not carried out on a portion of silicon nitride film SNF that is located in ground region GND, so that plasma damage resulting from the etching process can be suppressed from occurring in photodiode region PDR. Furthermore, the dangling bond of silicon can be terminated.

Furthermore, photodiode region PDR has a corner portion that is arranged to recede away from ground region GND or contact portion PGC so as to be further distanced therefrom. Thereby, plasma damage resulting from the etching process is reduced. Consequently, a dark current resulting from plasma damage can be reliably suppressed.

(PN Isolation)

The following is an explanation about the third example of an image pickup device in which a photodiode region and a ground region are isolated by a pn junction.

Figure 66:
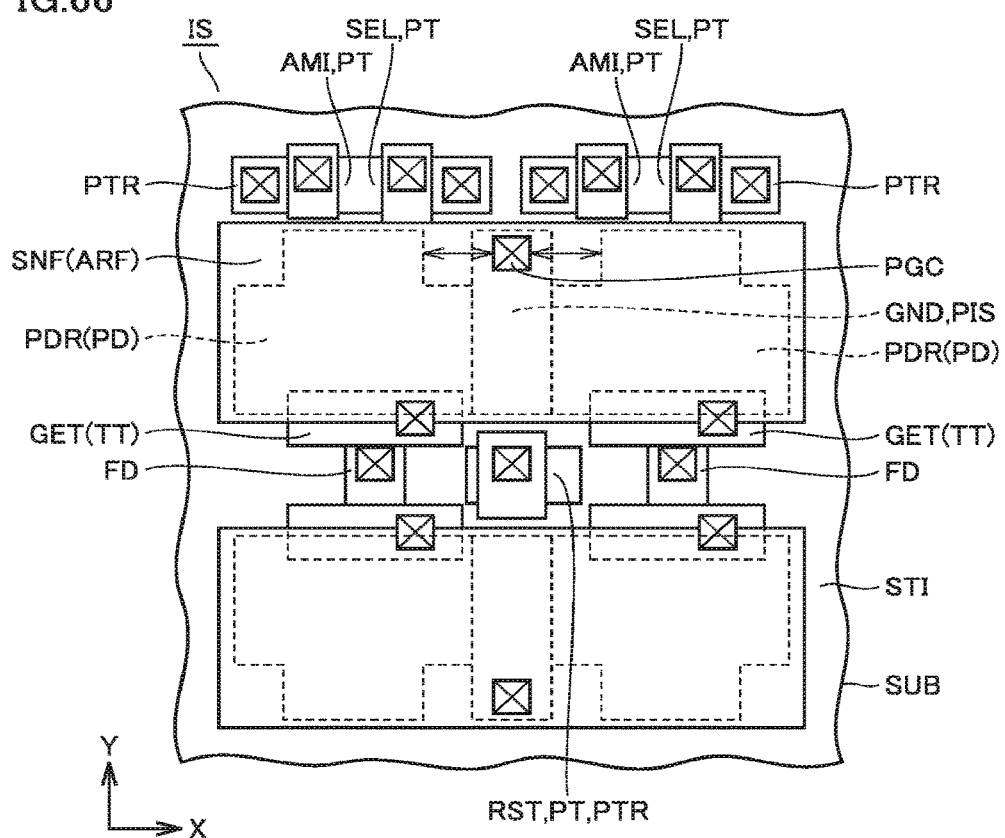
FIG. 66 is a plan view showing the third example of an image pickup device in which pn isolation is provided by a pn junction, according to the third embodiment.

As shown in FIG. 66, photodiode region PDR and ground region GND are arranged so as to be adjacent to each other. Photodiode region PDR and ground region GND are pn-isolated by a junction between N-type impurity region NR of photodiode PD (see FIG. 28) and P-type impurity region PIS of ground region GND (see FIG. 28).

Silicon nitride film SNF serving as antireflection film ARF is formed so as to cover at least photodiode region PDR and ground region GND. Particularly, the position of contact portion PGC in ground region GND is set on the end side of photodiode region PDR in the Y direction.

Photodiode region PDR has a corner portion that recedes so as to be distanced from contact portion PGC. In other words, photodiode region PDR is arranged so as to be further more distanced from contact portion PGC of ground region GND. Since the configuration other than the above is similar to that of image pickup device IS shown in each of FIGS. 27 and 28, the same components are designated by the same reference characters, and description thereof will not be repeated unless otherwise required.

In image pickup device IS as described above, photodiode region PDR and contact portion PGC of ground region GND are arranged so as to be further distanced from each other, so that a dark current in photodiode PD can be suppressed. This will be explained as compared with the image pickup device according to a comparative example.

Figure 67:
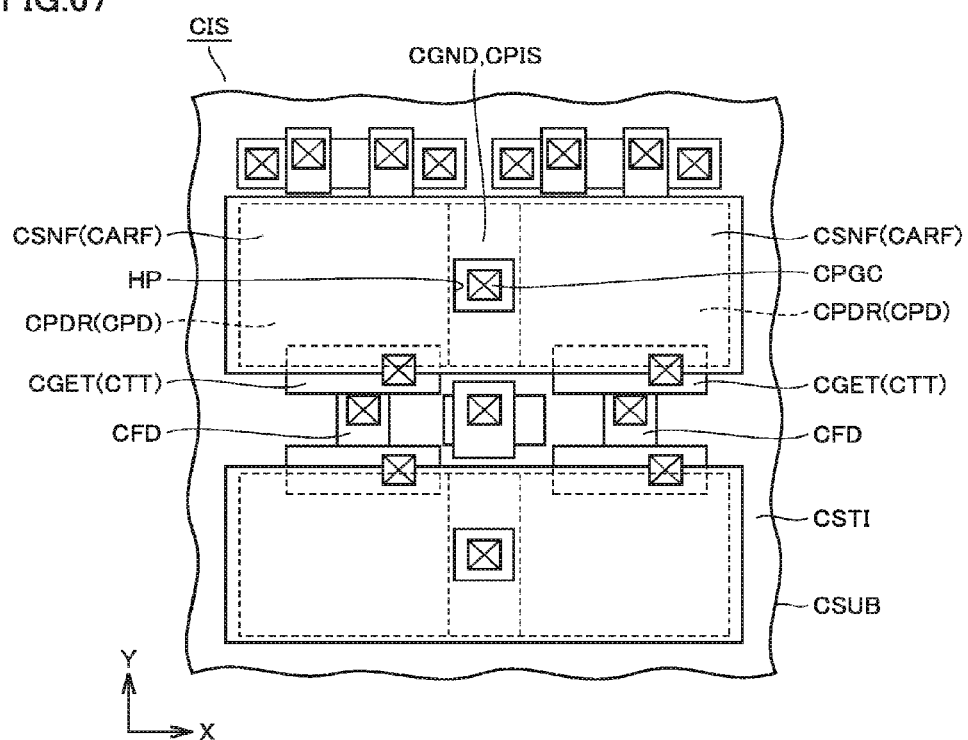
FIG. 67 is a plan view showing an image pickup device according to a comparative example.

In image pickup device CIS according to a comparative example, photodiode region CPDR and ground region CGND are arranged so as to be in contact with each other as shown in FIG. 67. Silicon nitride film CSNF serving as antireflection film CARF is formed so as to cover photodiode region CPDR and ground region CGND. Also in ground region CGND, opening HP is formed, through which a portion having contact hole CCH formed therein (a contact portion CPGC) and a portion therearound are exposed.

Accordingly, when opening HP is formed in a portion of silicon nitride film CSNF that is located in ground region CGND adjacent to photodiode region CPDR, plasma damage is more likely to occur in photodiode region CPDR due to the etching process. Consequently, a dark current may be generated in photodiode CPD.

In contrast to image pickup device CIS according to a comparative example, in image pickup device IS according to the present embodiment, antireflection film ARF is formed so as to cover at least photodiode region PDR and ground region GND. Accordingly, an etching process is not carried out on a portion of silicon nitride film SNF that is located in ground region GND, so that plasma damage resulting from the etching process can be suppressed from occurring in photodiode region PDR.

Also, contact portion PGC is arranged so as to be located on the end side of photodiode region PDR in the Y direction. Furthermore, photodiode region PDR has a corner portion that recedes so as to be distanced from contact portion PGC. Thereby, plasma damage resulting from the etching process during formation of antireflection film ARF can be reduced, so that a dark current generated in the photodiode can be suppressed. It is more preferable for reducing plasma damage that photodiode region PDR and contact portion PGC are more distanced from each other. This distance only has to be 0.1 μm or more, for example.

(PN Isolation)

The following is an explanation about the fourth example of an image pickup device in which a photodiode region and a ground region are isolated by a pn junction.

Figure 68:
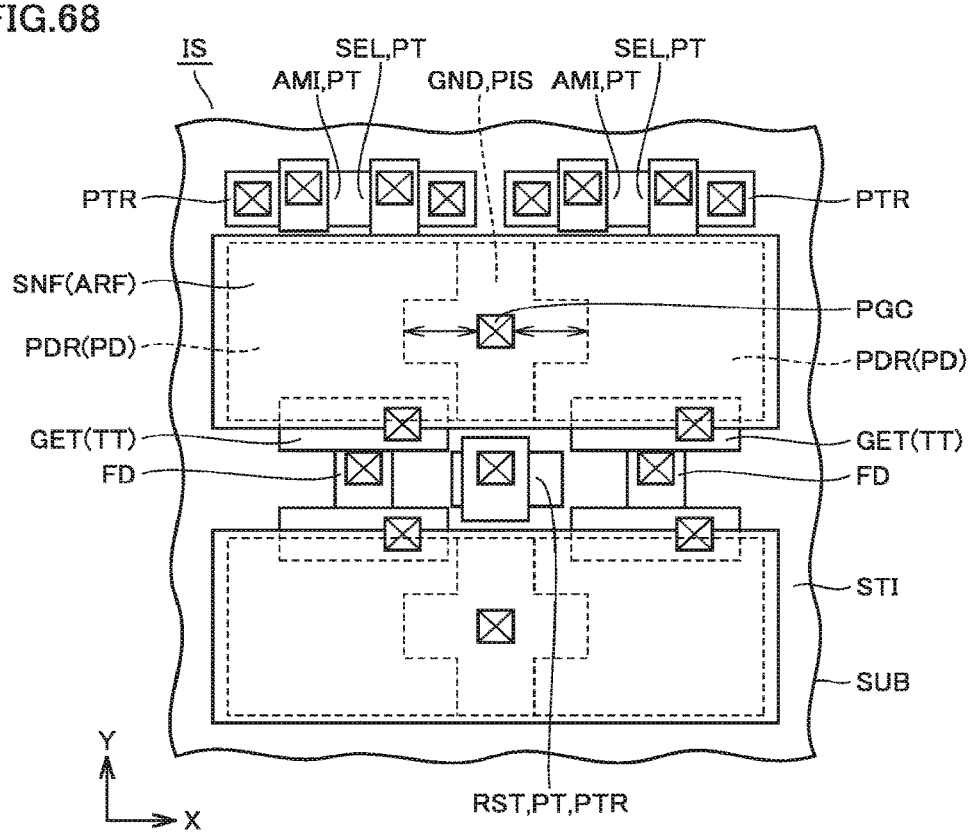
FIG. 68 is a plan view showing the fourth example of an image pickup device in which pn isolation is provided by a pn junction, according to the third embodiment.

As shown in FIG. 68, photodiode region PDR and ground region GND are arranged so as to be adjacent to each other. Photodiode region PDR and ground region GND are pn-isolated by a junction between N-type impurity region NR of photodiode PD (see FIG. 28) and P-type impurity region PIS of ground region GND (see FIG. 28).

Silicon nitride film SNF serving as antireflection film ARF is formed so as to cover at least photodiode region PDR and ground region GND. Particularly, contact portion PGC in ground region GND is arranged so as to be located at or around the center of photodiode region PDR in the Y direction.

A portion at or around the center of photodiode region PDR on the contact portion PGC side in the Y direction recedes so as to be distanced from contact portion PGC. In other words, photodiode region PDR is arranged so as to be further more distanced away from contact portion PGC of ground region GND. Since the configuration other than the above is similar to that of image pickup device IS shown in each of FIGS. 27 and 28, the same components are designated by the same reference characters, and description thereof will not be repeated unless otherwise required.

In image pickup device IS as described above, antireflection film ARF is formed so as to cover at least photodiode region PDR and ground region GND. Thus, an etching process is not carried out on a portion of silicon nitride film SNF that is located in ground region GND, so that plasma damage resulting from the etching process can be suppressed from occurring in photodiode region PDR.

Furthermore, contact portion PGC is arranged at or around the center of photodiode region PDR in the Y direction, a portion at or around the center of photodiode region PDR on the contact portion PGC side in the Y direction recedes so as to be distanced from contact portion PGC, and photodiode region PDR is arranged so as to be further more distanced from ground region GND (contact portion PGC). Thereby, plasma damage resulting from the etching process is reduced. Consequently, a dark current resulting from plasma damage can be reliably suppressed.

Figure 69:
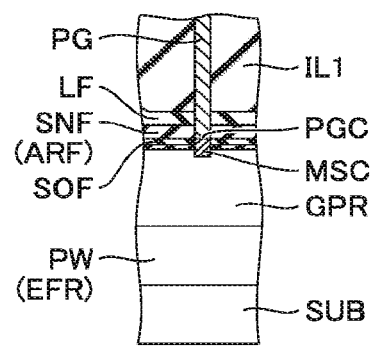
FIG. 69 is a partial cross-sectional view showing a modification of the manner of connecting a plug and a ground region in each embodiment.
Figure 70:
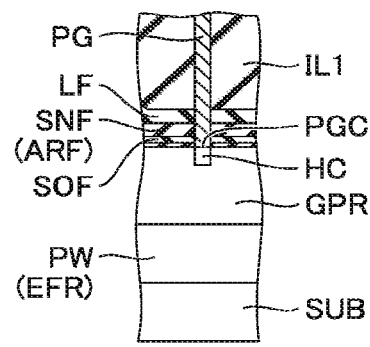
FIG. 70 is a partial cross-sectional view showing another modification of the manner of connecting the plug and the ground region in each embodiment.

In each of the above-described embodiments, a metal silicide film MSC may be formed in contact portion PGC through which plug PG is connected to ground region GND as shown in FIG. 69. Furthermore, a P-type impurity region HC having a relatively higher impurity concentration may be formed in a self-alignment manner relative to contact hole CH, as shown in FIG. 70. Thereby, the contact resistance between plug PG and ground region GND can be reduced.

Furthermore, semiconductor devices described in respective embodiments can be variously combined with each other as required.

Although the invention implemented by the present inventor has been specifically described based on the embodiments, the present invention is not limited to the above-described embodiments, but can be variously modified so as to fall within a scope without deviation from the features described herein.

What is claimed is:

1. A method of manufacturing an image pickup device, the method comprising the steps of:
    defining an element formation region having a first conductivity type in a semiconductor substrate, the element formation region including a pixel region and a ground region each having the first conductivity type;
    forming a photoelectric conversion portion in the pixel region;
    forming a transfer transistor gate electrode on the pixel region;
    forming an antireflection film so as to cover at least the photoelectric conversion portion and the ground region for suppressing reflection of light, the antireflection film also covering a portion of the transfer transistor gate electrode;
    forming an interlayer insulating film so as to cover the antireflection film; and
    forming a plug extending through the interlayer insulating film and the antireflection film, coming into contact with the ground region, and electrically connecting the ground region to a ground potential.

2. The method of manufacturing an image pickup device according to claim 1, wherein
    the step of defining an element formation region includes the step of defining, by an isolation insulating film, the ground region and a region having the photoelectric conversion portion formed therein, and
    the ground region and the photoelectric conversion portion are isolated by the isolation insulating film.

3. The method of manufacturing an image pickup device according to claim 2, wherein
    the step of forming an isolation insulating film includes the steps of:
    forming a trench in the semiconductor substrate; and
    forming the isolation insulating film in the trench.

4. The method of manufacturing an image pickup device according to claim 2, wherein
    the step of forming a photoelectric conversion portion includes the step of forming a guard ring having a first conductivity type on a side of the isolation insulating film along the isolation insulating film.

5. The method of manufacturing an image pickup device according to claim 1, wherein
    the step of forming a photoelectric conversion portion includes the step of forming a photoelectric conversion impurity region having a second conductivity type, and
    the ground region and the photoelectric conversion portion are junction-isolated by a junction between the photoelectric conversion impurity region having a second conductivity type and a portion of the ground region having a first conductivity type.

6. The method of manufacturing an image pickup device according to claim 1, comprising the step of forming a contact implantation portion by implanting impurities in a contact portion between the plug and the ground region.

7. The method of manufacturing an image pickup device according to claim 1, comprising the step of forming metal silicide in a contact portion between the plug and the ground region.

* * * * *